(12) United States Patent
Ahmed et al.

(10) Patent No.: US 11,545,391 B2
(45) Date of Patent: Jan. 3, 2023

(54) CONDUCTIVE INTERCONNECTS AND METHODS OF FORMING CONDUCTIVE INTERCONNECTS

(71) Applicant: Micron Technology, Inc., Boise, ID (US)

(72) Inventors: Raju Ahmed, Boise, ID (US); Frank Speetjens, Boise, ID (US); Darin S. Miller, Boise, ID (US); Siva Naga Sandeep Chalamalasetty, Boise, ID (US); Dave Pratt, Meridian, ID (US); Yi Hu, Boise, ID (US); Yung-Ta Sung, Boise, ID (US); Aaron K. Belsher, Boise, ID (US); Allen R. Gibson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 106 days.

(21) Appl. No.: 16/787,321

(22) Filed: Feb. 11, 2020

(65) Prior Publication Data
US 2021/0249304 A1  Aug. 12, 2021

(51) Int. Cl.
*H01L 21/768* (2006.01)
*H01L 23/522* (2006.01)

(52) U.S. Cl.
CPC .. *H01L 21/76883* (2013.01); *H01L 21/76831* (2013.01); *H01L 21/76843* (2013.01); *H01L 21/76861* (2013.01); *H01L 21/76865* (2013.01); *H01L 21/76885* (2013.01); *H01L 23/5226* (2013.01)

(58) Field of Classification Search
CPC ......... H01L 21/76883; H01L 21/76885; H01L 21/76861; H01L 21/76831
See application file for complete search history.

(56) References Cited

U.S. PATENT DOCUMENTS

| | | | |
|---|---|---|---|
| 6,235,632 B1 * | 5/2001 | Nogami | H01L 21/76841 257/E21.584 |
| 6,251,790 B1 * | 6/2001 | Jeong | H01L 21/76844 438/697 |
| 7,157,371 B2 * | 1/2007 | Hecht | H01L 21/76829 438/653 |
| 7,429,529 B2 | 9/2008 | Farnworth | |

(Continued)

FOREIGN PATENT DOCUMENTS

| | | |
|---|---|---|
| TW | 200741829 | 11/2007 |
| TW | 201612954 | 4/2016 |

(Continued)

*Primary Examiner* — Daniel Luke
(74) *Attorney, Agent, or Firm* — Wells St. John P.S.

(57) ABSTRACT

Some embodiments include a method of forming an integrated assembly. An arrangement is formed to include a conductive pillar extending through an insulative mass. An upper surface of the conductive pillar is recessed to form a cavity. An insulative collar is formed within the cavity to line an outer lateral periphery of the cavity. A recessed surface of the conductive pillar is exposed at a bottom of the lined cavity. A conductive expanse is formed over the insulative mass. A portion of the conductive expanse extends into the cavity and is configured as an interconnect. The conductive expanse is patterned into multiple conductive structures. One of the conductive structures includes the interconnect.

58 Claims, 15 Drawing Sheets

(56) References Cited

U.S. PATENT DOCUMENTS

| | | |
|---|---|---|
| 9,105,636 B2 | 8/2015 | Liu |
| 9,449,921 B1 * | 9/2016 | Basker .............. H01L 21/76843 |
| 9,564,442 B2 * | 2/2017 | Tang ................... H01L 27/1085 |
| 9,627,256 B2 * | 4/2017 | Tsai ................... H01L 21/76883 |
| 9,748,180 B2 | 8/2017 | Puri |
| 11,043,419 B2 | 6/2021 | Kume |
| 2005/0287803 A1 * | 12/2005 | Lee ................... H01L 21/76838 |
| | | 438/672 |
| 2014/0252622 A1 * | 9/2014 | Peng ................. H01L 23/53238 |
| | | 257/751 |
| 2015/0091172 A1 | 4/2015 | Ko |
| 2015/0262864 A1 | 9/2015 | Okamoto |
| 2017/0170118 A1 | 6/2017 | Fan |
| 2020/0381301 A1 | 12/2020 | Hong |

FOREIGN PATENT DOCUMENTS

| | | |
|---|---|---|
| TW | 202011515 | 3/2020 |
| TW | 109142081 | 9/2021 |

\* cited by examiner

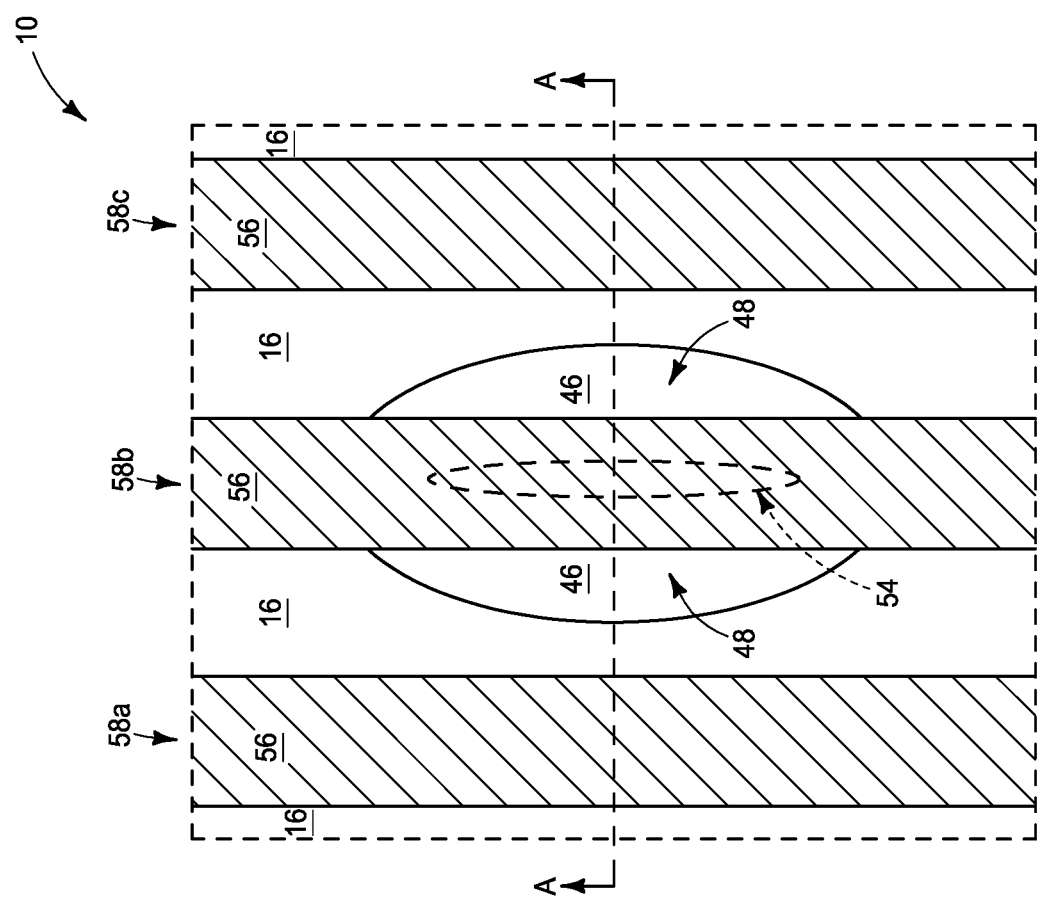

US 11,545,391 B2

CONDUCTIVE INTERCONNECTS AND METHODS OF FORMING CONDUCTIVE INTERCONNECTS

TECHNICAL FIELD

Integrated assemblies, memory arrays, conductive interconnects, and methods of forming conductive interconnects.

BACKGROUND

Memory is often incorporated into integrated circuitry. The memory may be used, for example, in computer systems for storing data.

Memory may be provided as a large array of memory cells. Wordlines (access lines) and bitlines (digit lines, sense lines) may be provided across the array such that individual memory cells may be uniquely addressed through the combination of a wordline and a bitline.

Conductive interconnects may be utilized to electrically couple circuitry from a lower level to circuitry of an upper level; and in some embodiments may be utilized for coupling wordlines with control circuitry (e.g., driver circuitry) and/or for coupling bitlines with sensing circuitry (e.g., sense-amplifier-circuitry).

A continuing goal of integrated circuit fabrication is to increase the level of integration (i.e., to scale circuitry to smaller dimensions). Wordlines and bitlines may become increasingly tightly packed across a memory array with increasing levels of integration.

Difficulties are encountered in increasing the level of integration of memory in that it becomes increasingly difficult to make suitable connections to the wordlines and bitlines. It is desired to develop new conductive interconnects suitable for making connections to wordlines and bitlines, and new methods of fabricating such interconnects. It may also be desirable for the new conductive interconnects to be suitable for making connections to tightly-packed integrated circuit components other than wordlines and bitlines.

Examples of the difficulties involved in making electrical connections to wordlines and bitlines are described with reference to FIGS. 1-4.

Referring to FIGS. 1A and 1B, an assembly 300 includes an electrical interconnect 302 extending through an insulative mass 304. The electrical interconnect couples a lower conductive structure 306 with an upper conductive structure 308b. The upper conductive structure 308b is shown to be one of several similar conductive lines 308 (with other conductive lines being labeled 308a and 308c). The conductive lines 308 may be wordlines or bitlines.

The electrical interconnect 302 is shown to comprise a conductive liner 310 which laterally surrounds a conductive core 312. The liner 310 may comprise metal nitride (e.g., titanium nitride or tungsten nitride), and the conductive core 312 may comprise metal (e.g., tungsten). The liner 310 may be provided to enhance adhesion for the metal of the conductive core 312 and/or to provide a seed layer during deposition/growth of the metal of the conductive core 312.

FIGS. 1A and 1B show a desired arrangement in which only the central line 308b is electrically coupled with the interconnect 302. However, problems may occur with increased levels of integration which lead to one or both of the conductive lines 308a and 308c shorting with the interconnect 302. For instance, FIGS. 2A and 2B show the assembly 300 in a problematic arrangement in which the line 308c is shorted to the interconnect 302 (with such shorting occurring in an illustrated region 314 shown in FIG. 2B). The shorting may result from misalignment of the line 308c (as shown) and/or from misalignment of the interconnect 302.

It is desired to alleviate or prevent the problematic shorting problems described with reference to FIGS. 2A and 2B.

It may be desired to have substantial overlap between the conductive line 308b and the core 312 as such may lead to reduced resistance as compared to configurations in which overlap is primarily with the liner 310 rather than the core 312. FIG. 3 shows a top view of the interconnect 302 in a desired arrangement in which the core 312 is a substantial portion of an upper surface of the interconnect 302. The arrangement of FIG. 3 provides opportunity for substantial overlap between the core 312 and the conductive line 308b (shown in FIG. 1A). However, in practice the core 312 may have a substantially different configuration, as shown in FIG. 4. Specifically, the core may end up as a narrow region along the upper surface of the interconnect 302. Such may reduce the desired overlap between the core 312 and the conductive line 308b, leading to problematic resistance. Also, the configuration of FIG. 4 may vary across the interconnects associated with an integrated arrangement (e.g., a memory array), leading to undesired nonuniformity of resistance across the various interconnects of the integrated arrangement.

It is desired to develop improved architectures in which the contacts between conductive lines (e.g., 308b) and underlying interconnects (e.g., 302) are consistent across an integrated arrangement, and are of desired low resistance.

BRIEF DESCRIPTION OF THE DRAWINGS

FIG. 17A is a diagrammatic top-down view of a region of the integrated assembly of FIG. 17. The view of FIG. 17 is along the line A-A of FIG. 17A.

DETAILED DESCRIPTION OF THE ILLUSTRATED EMBODIMENTS

Some embodiments include methods of forming conductive interconnects. The conductive interconnects may be utilized, for example, to couple conductive lines (e.g., wordlines, digit lines, etc.) with underlying logic circuitry (e.g., wordline-driver-circuitry, sense-amplifier-circuitry, etc. Example embodiments are described with reference to FIGS. 5-21.

Figure 5:
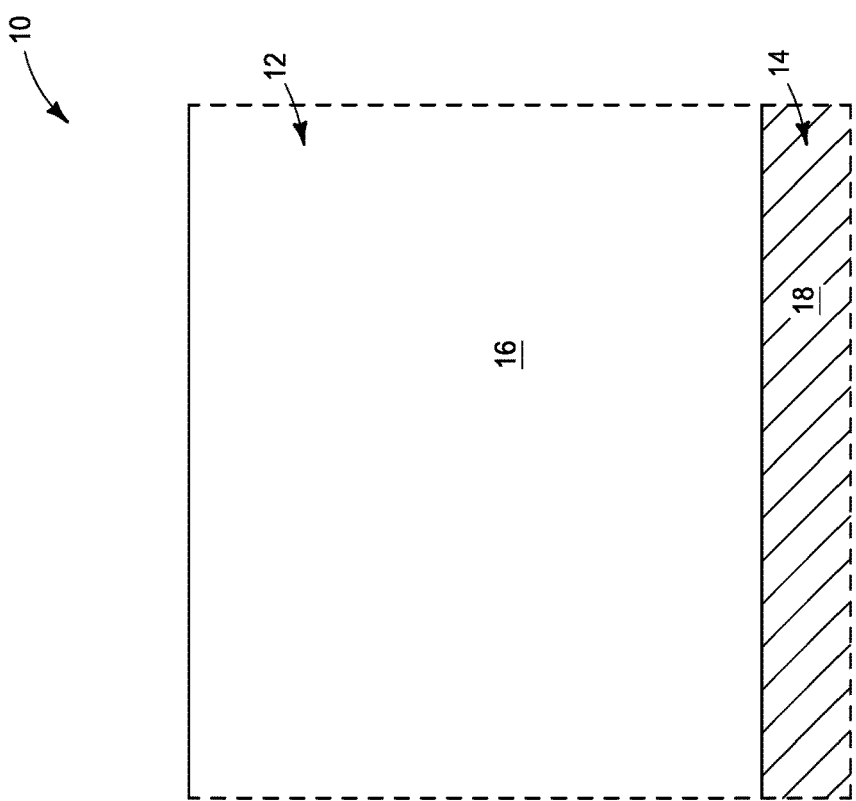

Referring to FIG. 5, an assembly 10 includes an insulative mass 12 over a conductive structure 14.

The insulative mass 12 comprises an insulative material 16. Such insulative material may comprise any suitable composition(s); and in some embodiments may comprise, consist essentially of, or consist of one or more of silicon dioxide, silicon nitride, aluminum oxide, hafnium oxide, etc.

The conductive structure 14 comprises an electrically conductive material 18. The material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 18 may comprise one or more of copper (Cu), silver (Ag), aluminum (Al), tungsten (W), platinum (Pt), palladium (Pd), conductively-doped silicon, metal nitride, metal silicide, etc.

The conductive structure 14 may be referred to as a first conductive structure to distinguish it from other conductive structures formed at subsequent process stages.

The conductive structure 14 may be electrically coupled with logic circuitry (not shown); such as for example, one or both of wordline-driver-circuitry and sense-amplifier-circuitry. The logic circuitry may comprise CMOS, and may be under the conductive structure 14. In some embodiments, the conductive structure 14 may be supported by a base (not shown), and the logic circuitry may be over such base and under the conductive structure 14.

The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

Figure 6:
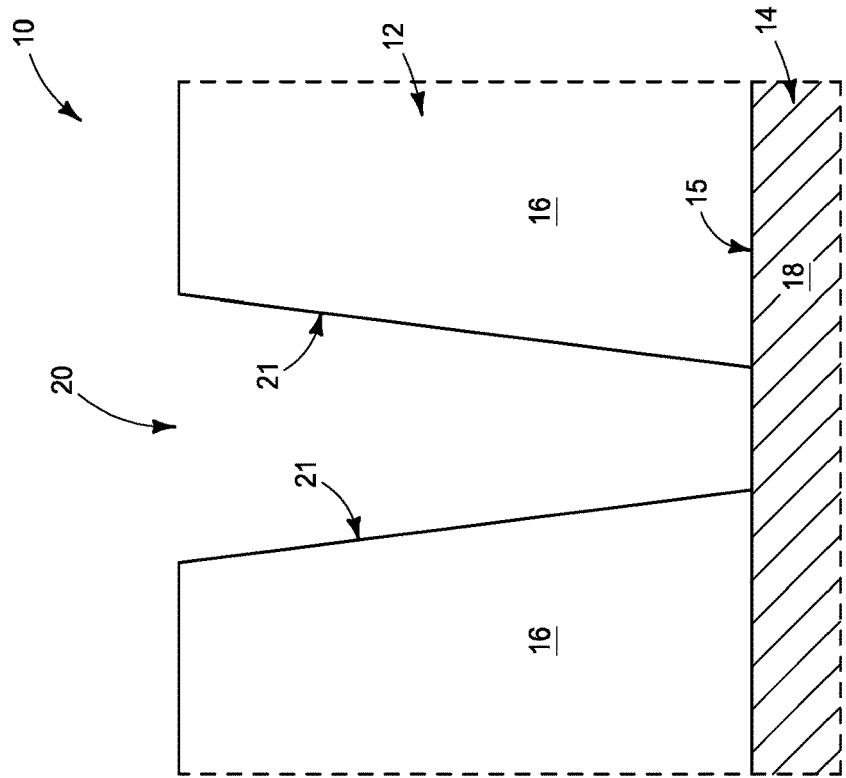
FIGS. 5-9 are diagrammatic cross-sectional side views of a region of an integrated assembly at sequential process stages of an example method.

Referring to FIG. 6, an opening 20 is formed to extend through the insulative mass 12 to an upper surface 15 of the conductive structure 14. The opening 20 has sidewalls 21. The sidewalls 21 are shown to be somewhat tapered. In other embodiments the sidewalls 21 may be more tapered, less tapered, or even not tapered. Also, although the sidewalls are shown to be straight, in other embodiments at least some regions of the sidewalls may be curved.

In the illustrated embodiment, the opening 20 stops at the top surface 15 of the conductive structure 14. In other embodiments, the opening 20 may penetrate into the conductive structure 14.

Figure 7:
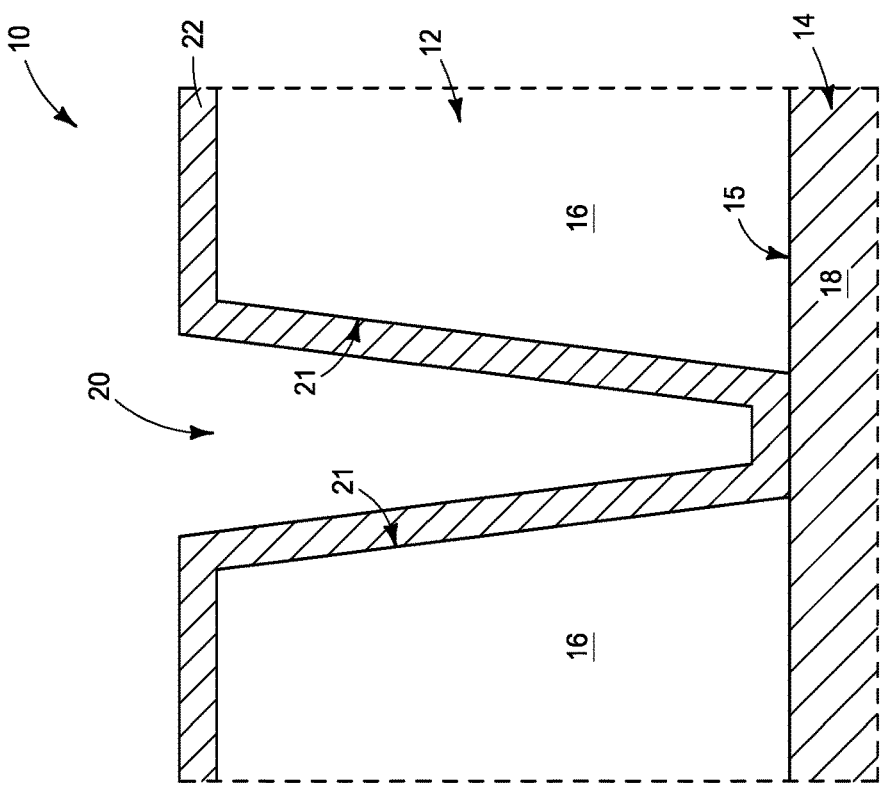

Referring to FIG. 7, a conductive liner material 22 is formed over the mass 12 and within the opening 20. The liner material 22 lines the sidewalls 21 of the opening 20.

The liner material 22 may comprise any suitable composition(s). For instance, the liner material 22 may comprise, consist essentially of, or consist of one or more of metal nitride, metal silicide and metal carbide. In some embodiments, the liner material 22 may comprise one or both of tungsten nitride and titanium nitride.

Figure 8:
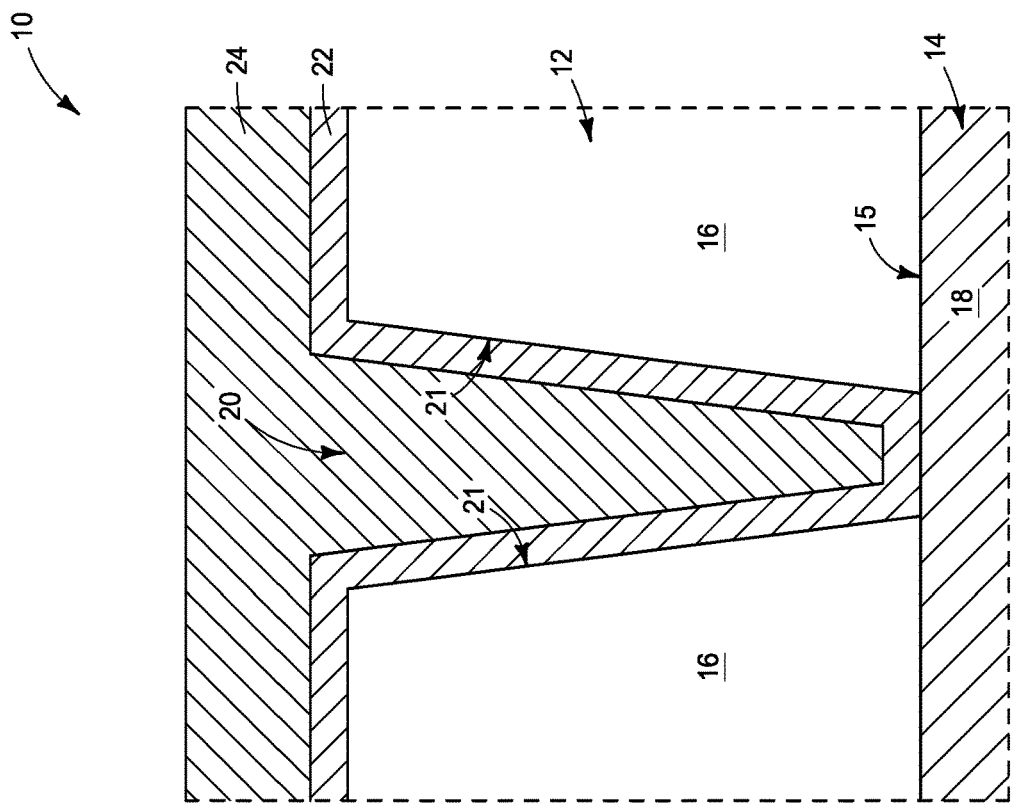

Referring to FIG. 8, a conductive core material 24 is formed within the opening 20 and along the lined sidewalls 21.

The conductive core material 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive core material 24 may comprise, consist essentially of, or consist of one or more metals. For instance, the conductive core material 24 may comprise, consist essentially of, or consist of tungsten.

The liner material 22 may be utilized to enhance adhesion of the core material 24 and/or may be utilized as a seed layer to promote growth of the core material 24 during deposition of such core material.

In the illustrated embodiment the liner material 22 is a single homogeneous composition, and the core material 24 is also a single homogeneous composition. In other embodiments the liner material 22 may comprise a laminate of two or more different compositions, and/or the core material 24 may comprise a laminate of two or more different compositions.

Figure 9A:
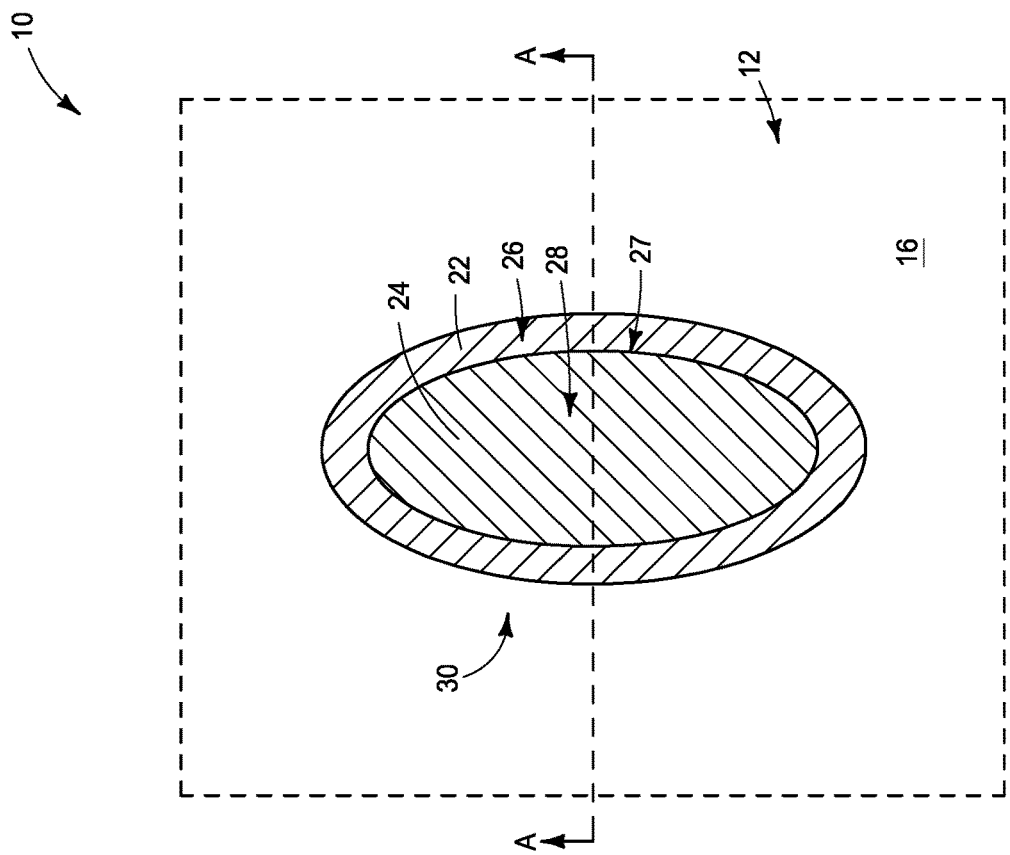
FIG. 9A is a diagrammatic top-down view of a region of the integrated assembly of FIG. 9. The view of FIG. 9 is along the line A-A of FIG. 9A.
Figure 9:
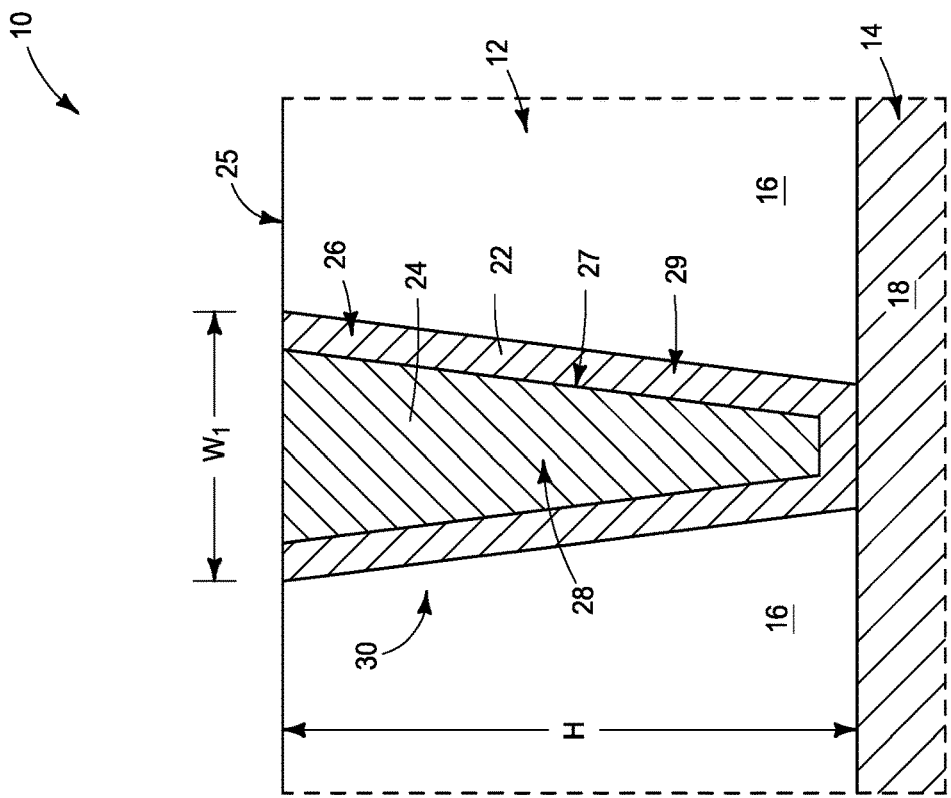

Referring to FIG. 9, the assembly 10 is subjected to planarization (e.g., chemical-mechanical polishing, CMP) to form a substantially planar surface 25 which extends across the insulative mass 12, the liner material 22 and the core material 24. The surface 25 is referred to as being "substantially planar" to indicate that the surface is planar to within reasonable tolerances of fabrication and measurement.

The formation of the substantially planar surface 25 removes excess materials 22 and 24 from over the insulative mass 12, patterns the remaining liner material 22 into a conductive liner 26 within the opening 20, and patterns the remaining core material 24 into a conductive core structure (conductive plug) 28 within the opening. The liner 26 laterally surrounds an outer peripheral surface (outer periphery) 27 of the core structure 28, as shown in the top-down view of FIG. 9A.

The liner 26 and core structure 28 together form a construction (conductive pillar) 30. Such construction has a width (horizontal dimension) $W_1$ along the cross-section of FIG. 9. Such width may be, for example, within a range of from about 10 nanometers (nm) to about 50 nm.

The conductive pillar 30 has a height (vertical dimension) H. Such height may be, for example, within a range of from about 100 nm to about 500 nm.

The conductive pillar 30 may be considered to comprise the liner 26 as an upwardly-opening conductive container 29, and to comprise the conductive plug 28 within such upwardly-opening conductive container. The conductive plug 28 is electrically coupled with the conductive structure 14 through the conductive material 22 of the conductive container 29.

Figure 10:
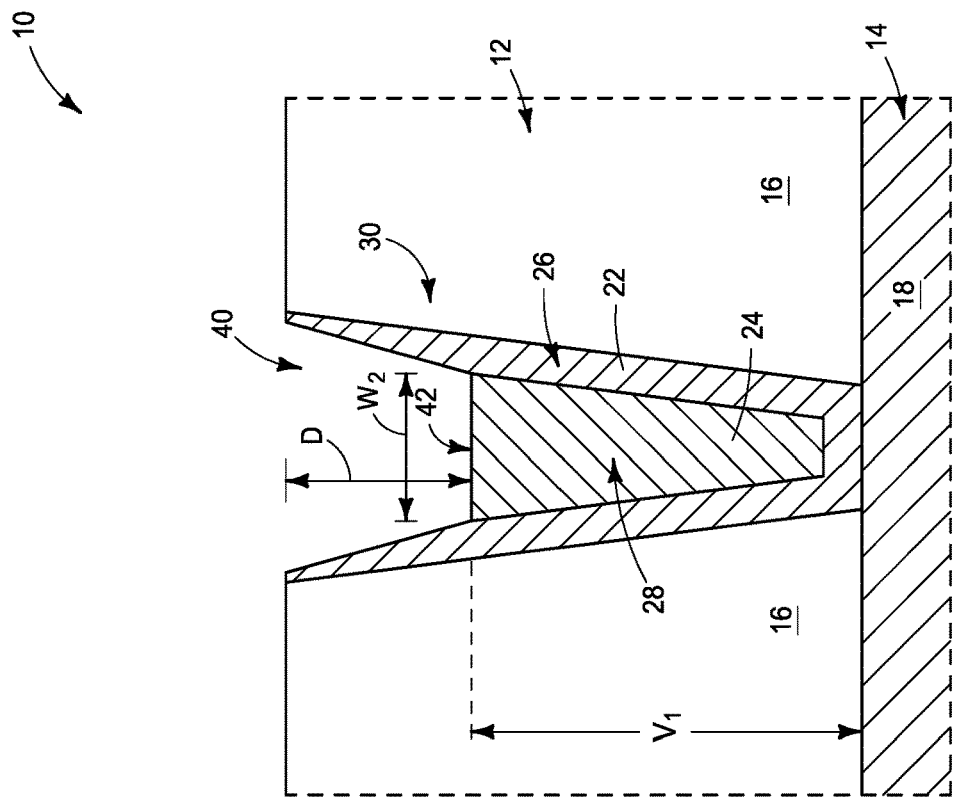

Referring to FIG. 10, an upper surface of the conductive pillar 30 is recessed to form a cavity 40. A recessed upper surface 42 of the conductive pillar 30 is along the bottom of the cavity 40. In the illustrated embodiment, the liner 26 is also etched during the formation of the cavity 40.

The cavity 40 may be formed with any suitable etching. In some embodiments the core material 24 comprises tungsten, and the liner material 22 comprises one or both of titanium nitride and tungsten nitride. In such embodiments the etch utilized to form the cavity 40 may utilize wet etching with ammonia-containing etchant. Alternatively, the etch may utilize dry etching with one or more of CF, BCl and O; where the chemical formulas indicate primary constituents rather than specific stoichiometries.

The cavity 40 may be formed to any suitable depth D, and in some embodiments such depth may comprise a dimension within a range of from about 5% to about 40% of the original height H shown in FIG. 9. Alternatively considered, height H of FIG. 9 may be considered to be a first vertical dimension, and the pillar 30 may be considered to have a second vertical dimension Vi to the recessed upper surface 42 at the process stage of FIG. 10; with such second vertical dimension being within a range of from about 60% to about 95% of the first vertical dimension.

In some embodiments the cavity 40 may be considered to remove a portion of the conductive plug 28 (core material 24) to leave a remaining portion of the conductive plug 28 (core material 24) under the cavity 40.

The recessed surface 42 has a lateral dimension (width) $W_2$ along the cross-section of FIG. 10. In some embodiments the width $W_2$ may be within a range of from about 8 nm to about 40 nm. In some embodiments, the width $W_1$ of the upper surface of the conductive pillar 30 at the process stage of FIG. 9 may be referred to as a first width, and the width $W_2$ of the recessed surface 42 at the process stage of FIG. 10 may be referred to as a second width.

Figure 11:
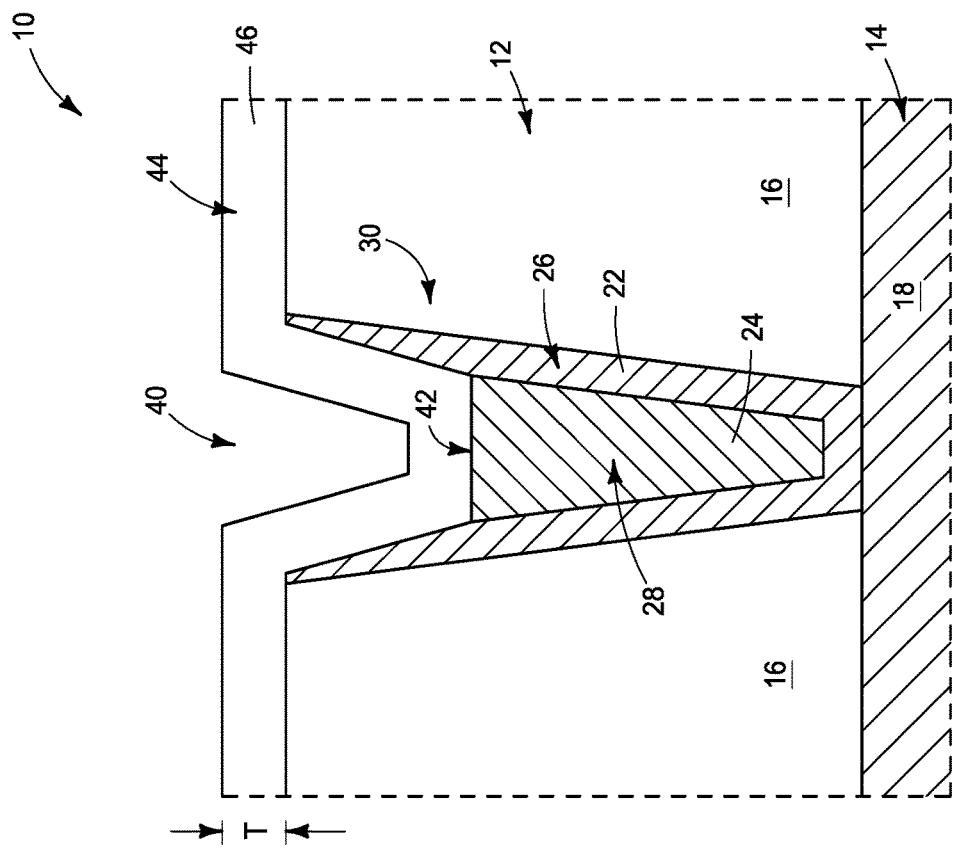
FIGS. 10-12 are diagrammatic cross-sectional side views of a region of an integrated assembly at sequential process stages of an example method. The process stage of FIG. 10 may follow that of FIG. 9.

Referring to FIG. 11, a layer 44 of insulative material 46 is formed over the insulative mass 12 and within the cavity 40. The insulative material 46 may comprise any suitable composition(s). In some embodiments, the insulative material 46 may comprise, consist essentially of, or consist of one or more oxides (e.g., aluminum oxide, hafnium oxide, zirconium oxide, silicon dioxide, etc.). In some embodiments, the insulative material 46 may comprise, consist essentially of, or consist of one or both of silicon dioxide and silicon nitride.

The insulative material 46 may be deposited utilizing any suitable methodology. In some embodiments, the insulative material 46 may be deposited utilizing one or both of atomic layer deposition (ALD) and chemical vapor deposition (CVD) to achieve a desired conformal lining of the material 46 along a peripheral surface of the cavity 40. In some embodiments, the insulative material 46 may comprise silicon dioxide which is originally deposited utilizing CVD with tetraethyl orthosilicate (TEOS).

The material 46 may have any suitable thickness T. In some embodiments such thickness may be within a range of from about 2 nm to about 20 nm.

Figure 12A:
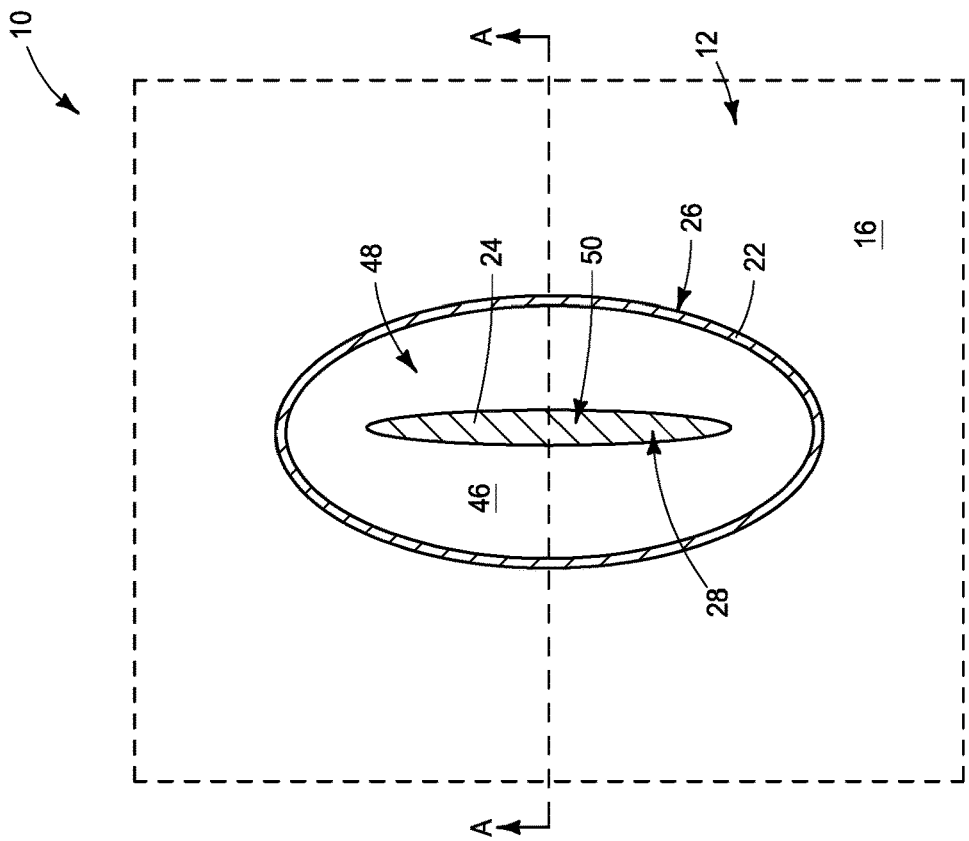
FIG. 12A is a diagrammatic top-down view of a region of the integrated assembly of FIG. 12. The view of FIG. 12 is along the line A-A of FIG. 12A.
Figure 12:
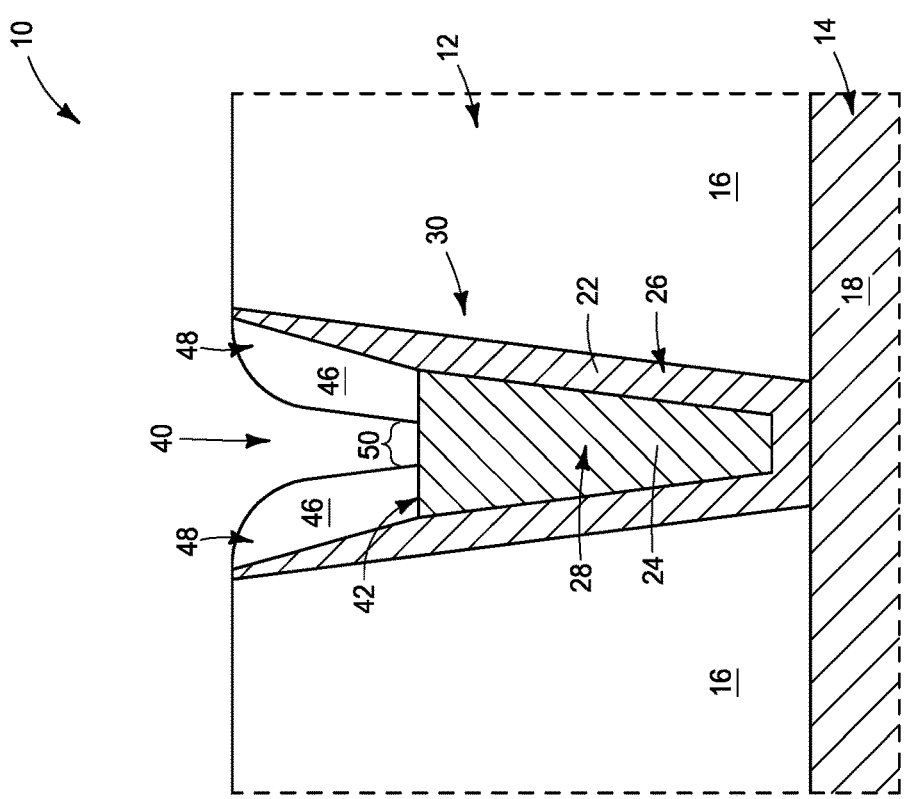

Referring to FIG. 12, the material 46 is anisotropically etched to pattern such material into a spacer (collar) 48 within the cavity 40. The spacer lines an outer lateral periphery of the cavity 40. A region 50 of the recessed surface 42 is exposed at the bottom of the lined cavity. In some embodiments the spacer 48 may be considered to narrow the cavity 40, and the region 50 may be considered to be a portion of the upper surface of the plug 28 which is exposed at the bottom of the narrowed cavity.

The material 46 may be anisotropically etched with any suitable processing. In some embodiments the material 46 may comprise silicon dioxide and may be dry-etched utilizing one or more of CF, BCl and O, where the chemical formulas indicate primary constituents rather than specific stoichiometries.

FIG. 12A shows a top view of the assembly 10 at the process stage of FIG. 12. The spacer (collar) 48 is shown laterally surrounding the exposed region 50 of the plug 28. In the illustrated embodiment, a portion of the liner 26 remains exposed along an outer peripheral surface of the spacer 46. In other words, a region of the liner material 22 is not covered by the insulative spacer 48.

Figure 13:
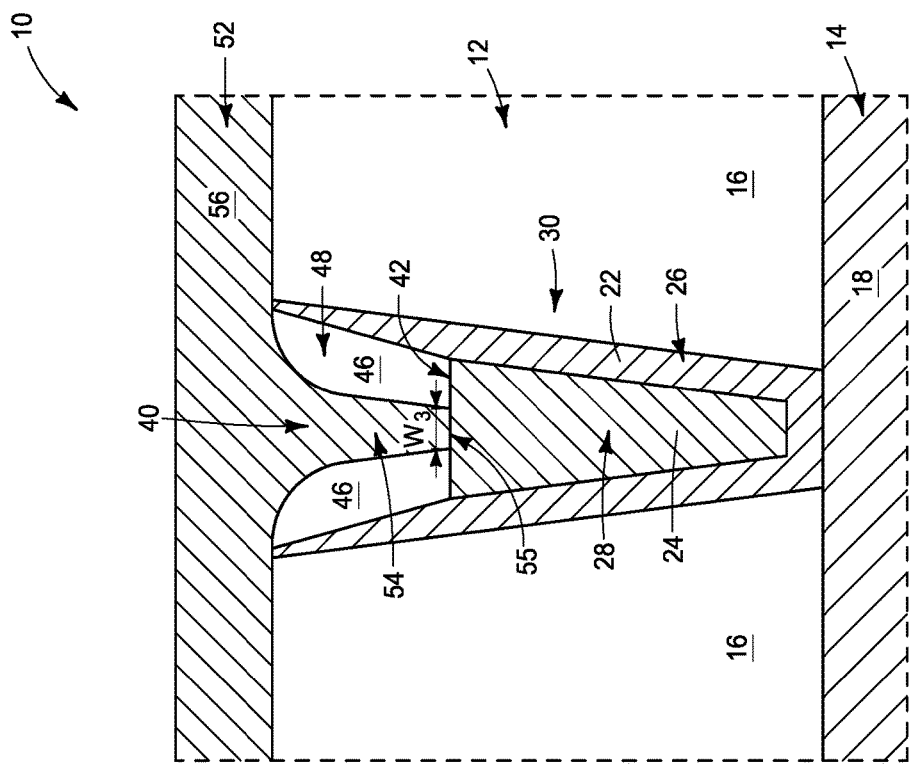

Referring to FIG. 13, a conductive expanse 52 is formed over the insulative mass 12. A portion of the conductive expanse extends into the cavity 40. Such portion is configured as a vertically-extending interconnect 54. In the illustrated embodiment, a bottom surface 55 of the vertically-extending interconnect 54 is directly against the upper surface 42 of the conductive plug 28.

The lowermost portion of the vertically-extending interconnect 54 (i.e., the portion directly against the upper surface 42 of the plug 28) has a horizontal dimension (width) $W_3$ along the cross-section of FIG. 13. In some embodiments such width may be within a range of from about 5 nm to about 20 nm.

The expanse 52 comprises conductive material 56. Such conductive material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 14:
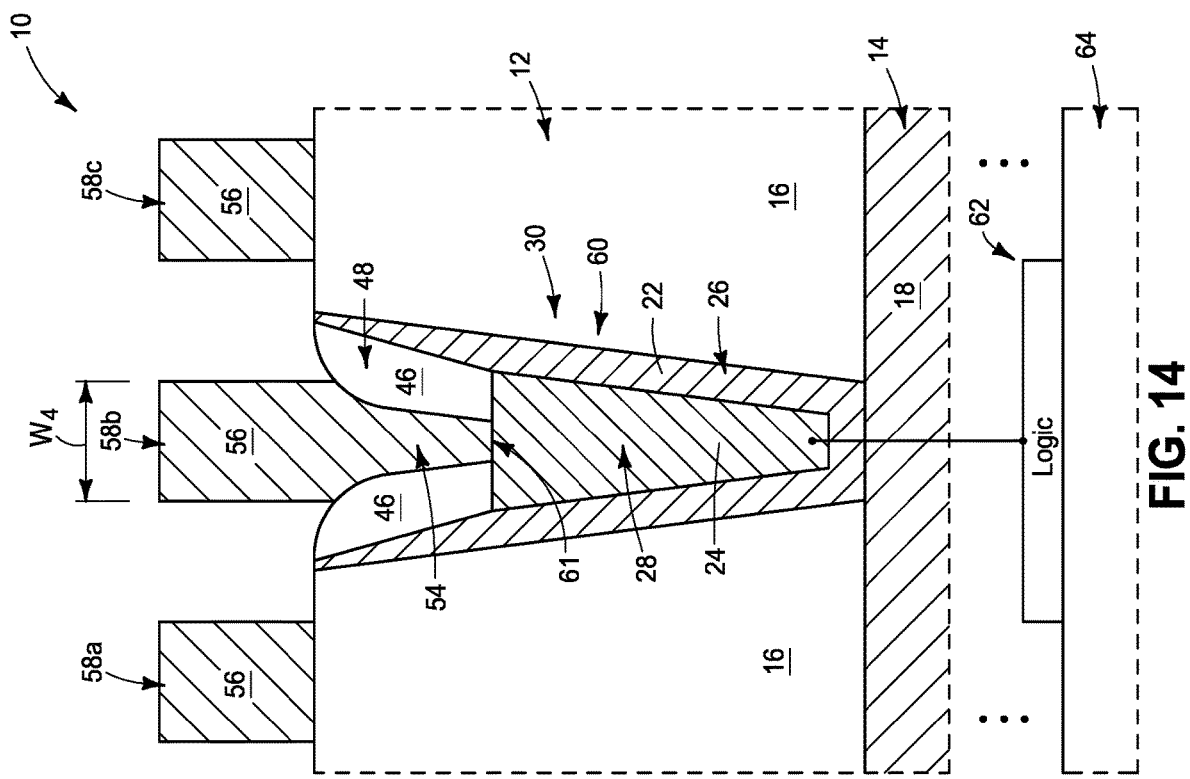
FIGS. 13 and 14 are diagrammatic cross-sectional side views of a region of an integrated assembly at example process stages of an example method. The process stage of FIG. 13 may follow that of FIG. 12.

Referring to FIG. 14, the conductive expanse 52 is patterned into conductive structures 58. The illustrated conductive structures are labeled as 58a, 58b and 58c so that they may be distinguished relative to one another.

The central conductive structure 58b includes the vertically-extending interconnect 54. In some embodiments, the conductive structure 58b may be referred to as a second conductive structure. Such second conductive structure is electrically coupled to the first electrically conductive structure 14 through a connection which includes the conductive plug 28 (core material 24) and the vertically-extending interconnect 54.

The conductive structure 58b has a width (horizontal dimension) $W_4$ along the cross-section of FIG. 14. Such width may be, for example, greater than or equal to about 30 nm.

The pillar 30 of FIG. 14 may be considered to correspond to a conductive interconnect 60, and the structures 58 may be considered to correspond to wordlines or bitlines. The conductive interconnect 60 may be utilized for coupling the structure 58b to logic circuitry 62. In the illustrated embodiment, such logic circuitry is under the structures 58, and may be under a memory array comprising the structures 58. In other embodiments, at least some of the logic circuitry 62 may be in other locations; such as, for example, laterally outward of a memory array, above the memory array, etc. The logic circuitry 62 may include CMOS. In some embodiments, the structures 58 may correspond to bitlines, and the logic circuitry 62 may comprise sense-amplifier-circuitry coupled with such bitlines. In some embodiments, the structures 58 may correspond to wordlines, and the logic circuitry 62 may comprise wordline-driver-circuitry coupled with such wordlines.

The logic circuitry 62 is shown to be supported by a base 64. The base 64 may correspond to a semiconductor substrate, and in some embodiments may comprise monocrystalline silicon.

A gap is provided between the base 64 and the conductive structure 14 to indicate that there may be other materials and/or components provided between the base 64 and the conductive structure 14.

The configuration of FIG. 14 advantageously couples the component 58b to the conductive plug 28 (core material 24) through the vertically-extending interconnect 54. The interconnect 54 may be representative of a large number of substantially identical interconnects formed across an assembly; with the term "substantially identical" meaning identical to within reasonable tolerances of fabrication and measurement. An interface 61 between the interconnect 54 and the core material 24 may have desired low resistance if the materials 56 and 24 are compatible to achieve such low resistance. In some embodiments, the materials 24 and 56 may be the same composition as one another (e.g., may both comprise tungsten). The interface 61 may be representative of a large number of substantially identical interfaces formed across the assembly 10. The interfaces 61 of the assembly 10 may be fabricated with high uniformity so that resistance across all of the interfaces is substantially identical, which may improve performance of devices formed in accordance with embodiments described herein relative to conventional devices.

Figure 14A:
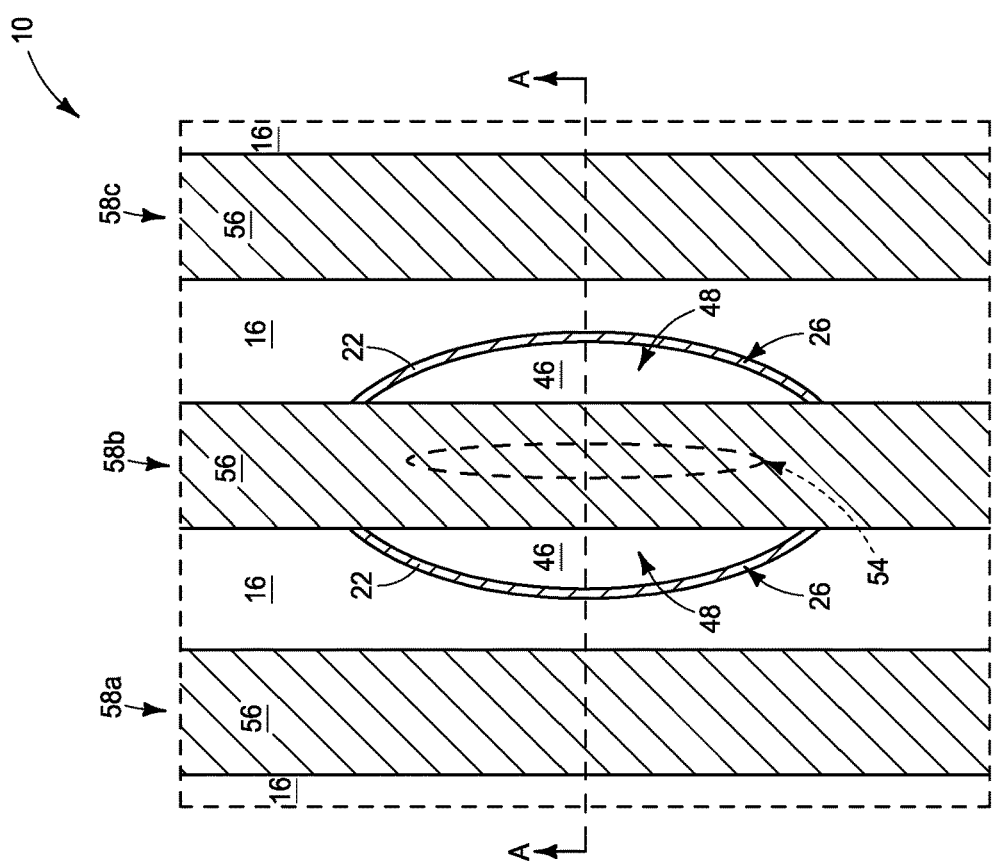
FIG. 14A is a diagrammatic top-down view of a region of the integrated assembly of FIG. 14. The view of FIG. 14 is along the line A-A of FIG. 14A.

FIG. 14A shows a top view of the assembly 10 of FIG. 14. The structures 58 are shown to be lines (e.g., wordlines, bitlines, etc.) extending across a region of the assembly. The line 58b is over the interconnect 54 (with such interconnect being shown in phantom view in FIG. 14A to indicate that it is under the bulk of the line 58b).

Figure 1B:
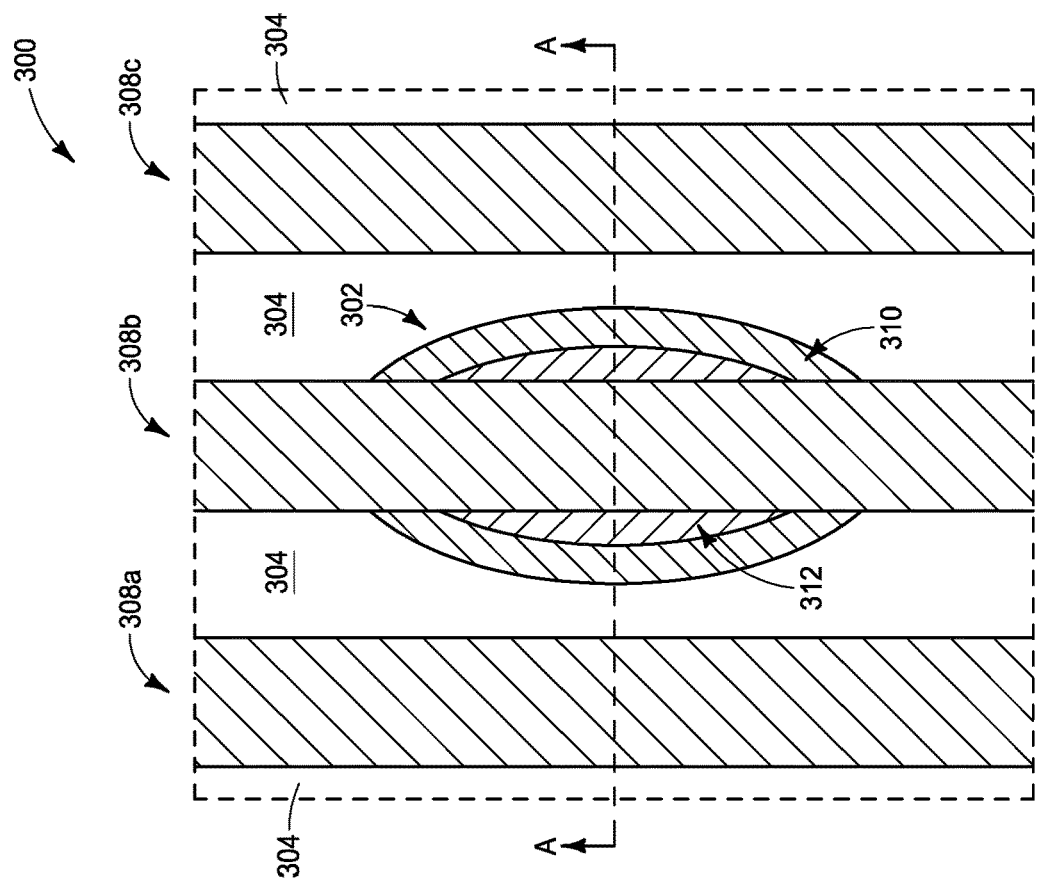
FIGS. 1A and 1B are a diagrammatic cross-sectional side view and a diagrammatic top-down view of a region of a prior art integrated assembly. The view of FIG. 1A is along the line A-A of FIG. 1B.
Figure 1A:
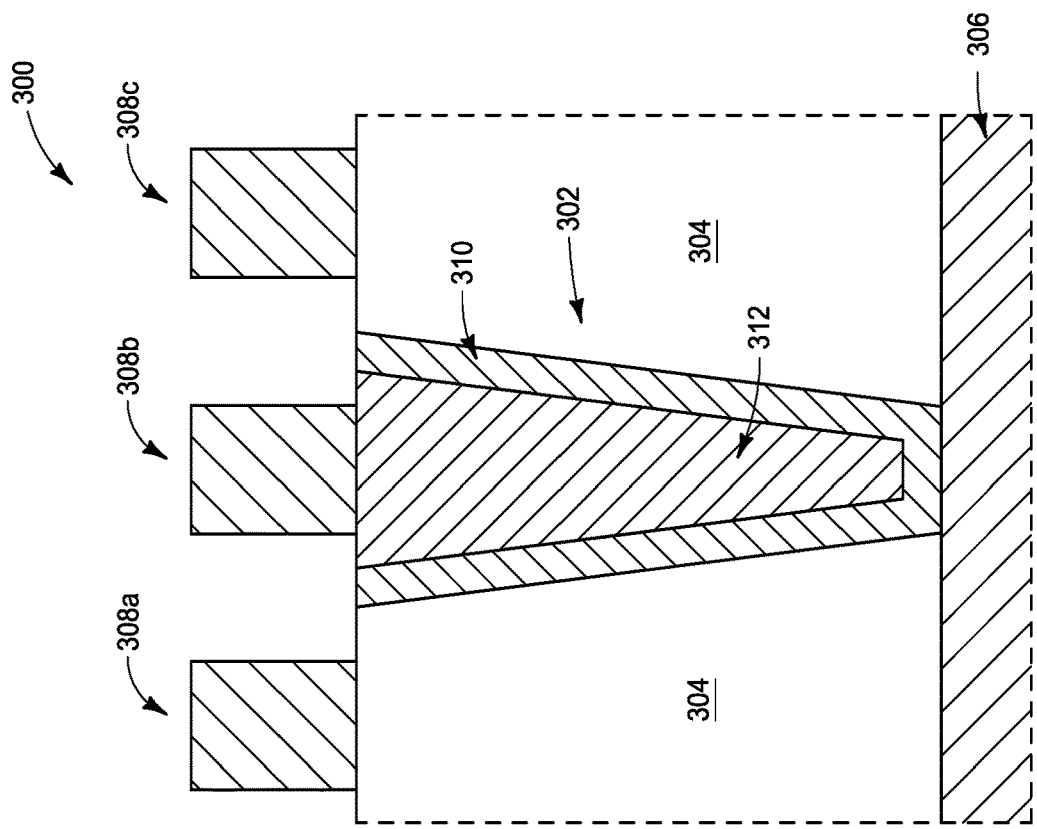
Figure 2B:
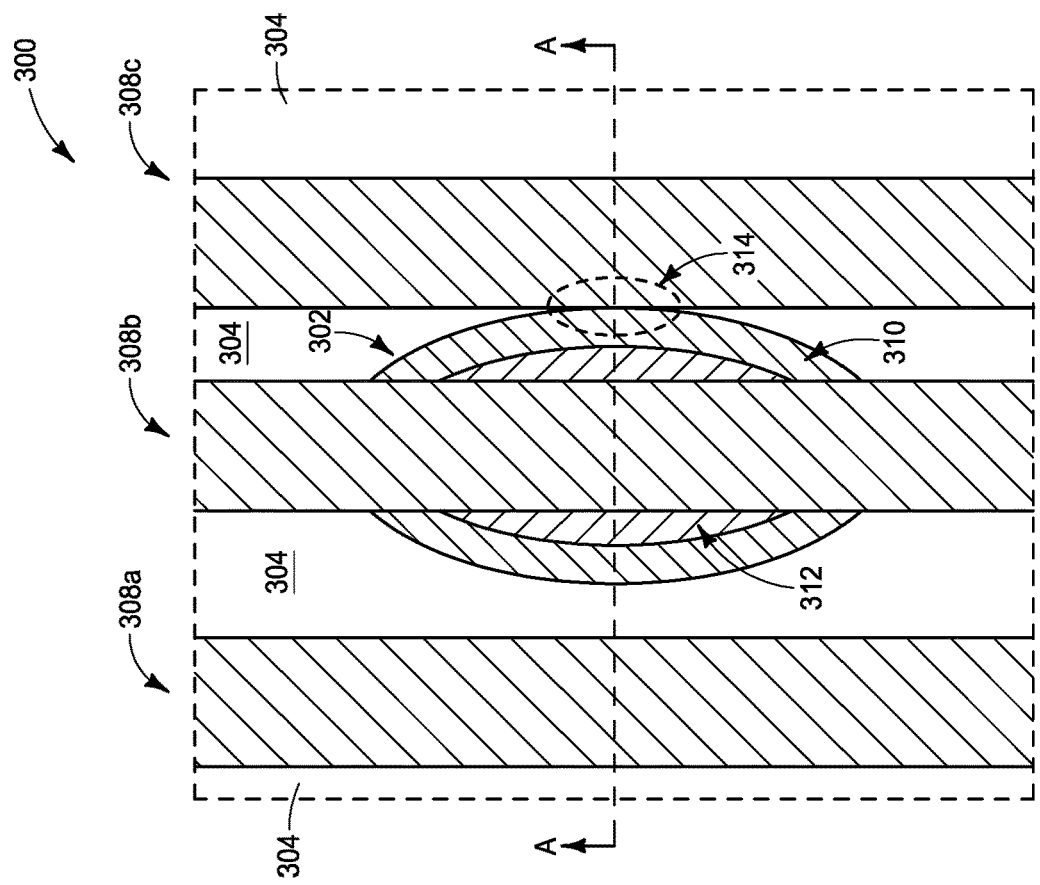
FIGS. 2A and 2B are a diagrammatic cross-sectional side view and a diagrammatic top-down view of a region of another prior art integrated assembly. The view of FIG. 2A is along the line A-A of FIG. 2B.
Figure 2A:
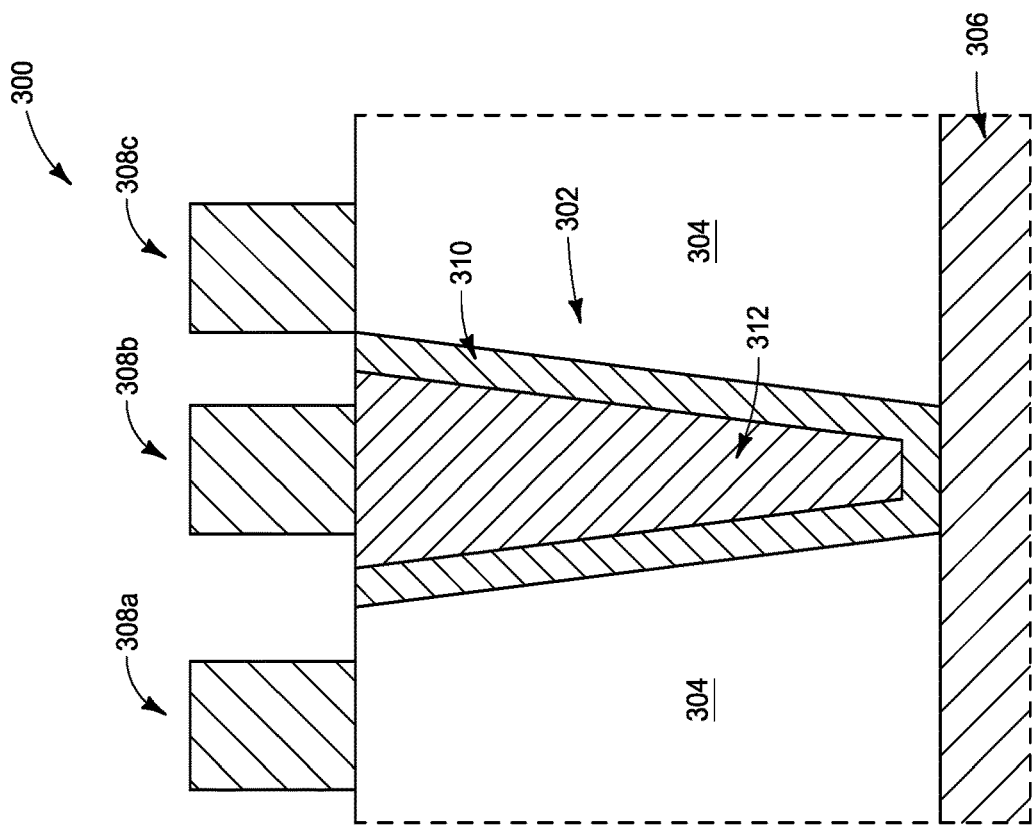
Figure 4:
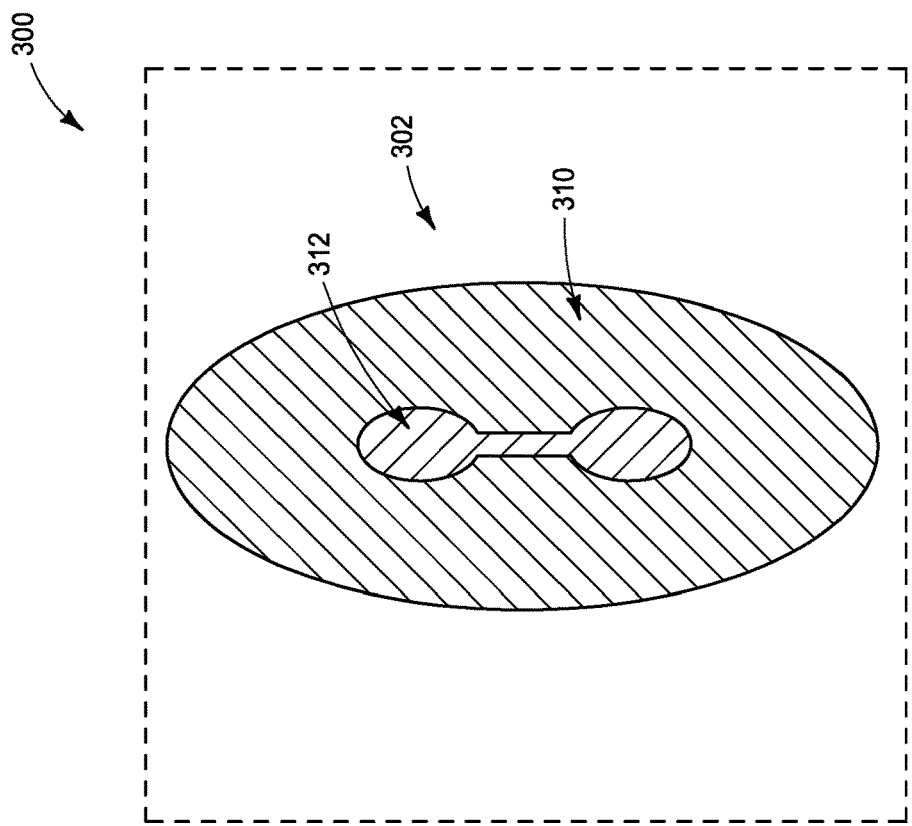
FIGS. 3 and 4 are diagrammatic top-down views of regions of prior art integrated assemblies.
Figure 3:
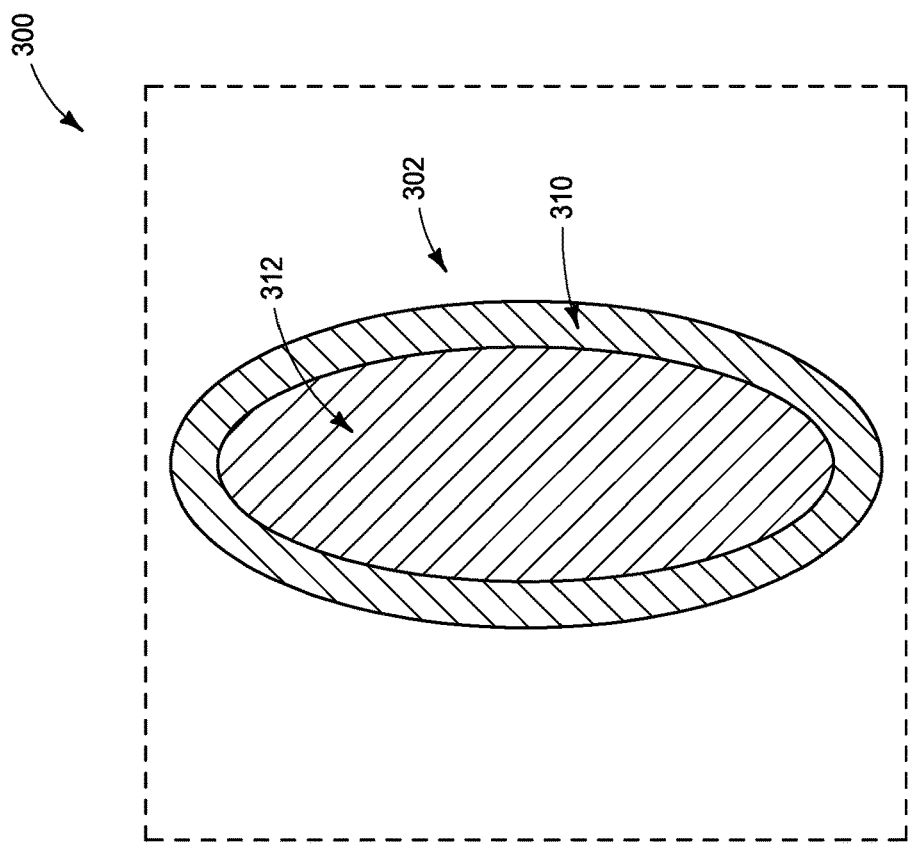

The conductive material 22 of the liner 26 surrounds a periphery of the insulative spacer 48. Such may be appropriate for some embodiments. In other embodiments, the exposed liner 26 may be problematic, in that it may enable a short to occur to an adjacent line (58a or 58c) if there is misalignment of the type described above with reference to FIG. 2B. In some embodiments, the exposed region of the liner material 22 may be eliminated by forming the spacer 48 to extend over an entirety of the liner material 22. An example of such embodiments is described with reference to FIGS. 15-17.

Figure 15:
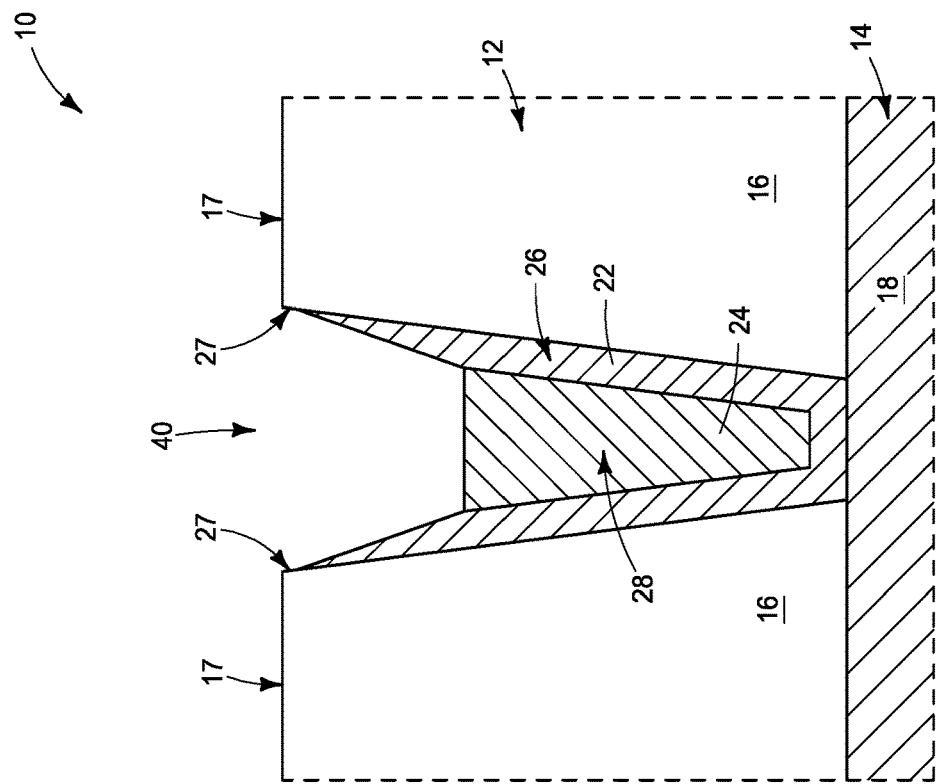
FIGS. 15-17 are diagrammatic cross-sectional side views of a region of an integrated assembly at sequential process stages of an example method. The process stage of FIG. 15 may follow that of FIG. 9.

Referring to FIG. 15, the assembly 10 is shown at a process stage which may follow the process stage of FIG. 9. The process stage of FIG. 15 is similar to that of FIG. 10, except that the liner material 22 is more fully recessed at the process stage of FIG. 15. Accordingly, an upper surface 27 of the liner material 22 is recessed to be beneath an upper surface 17 of the insulative mass 16.

Figure 16:
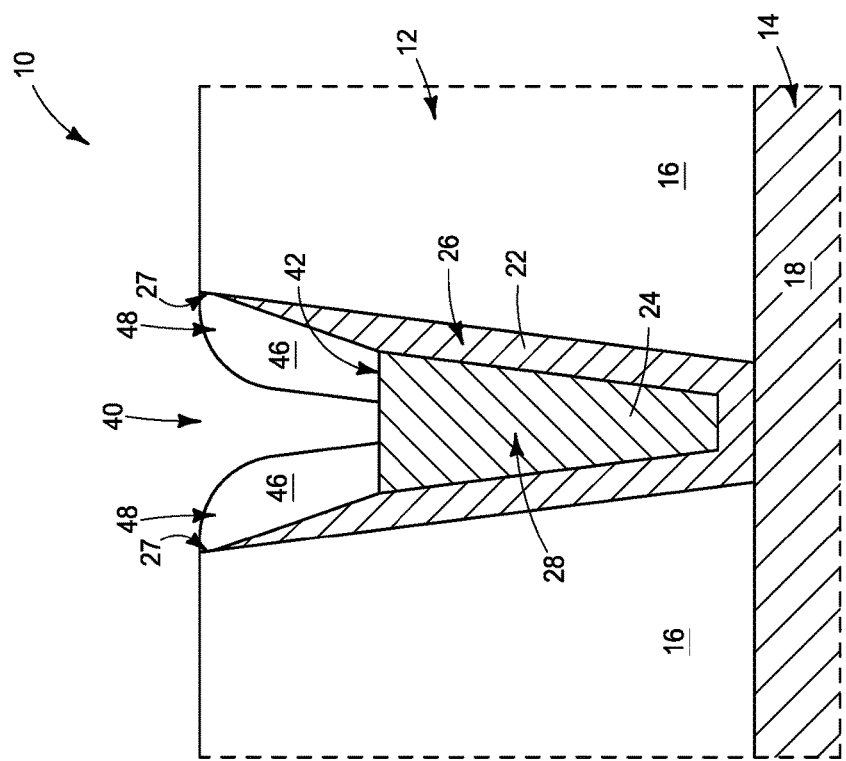

Referring to FIG. 16, the spacers (collars) 48 are formed with processing analogous to that described above with reference to FIGS. 11 and 12. The spacers 48 are over the recessed upper surface 27 of the liner 26. Accordingly, the liner 26 is not exposed along a top of the assembly 10.

Figure 17:
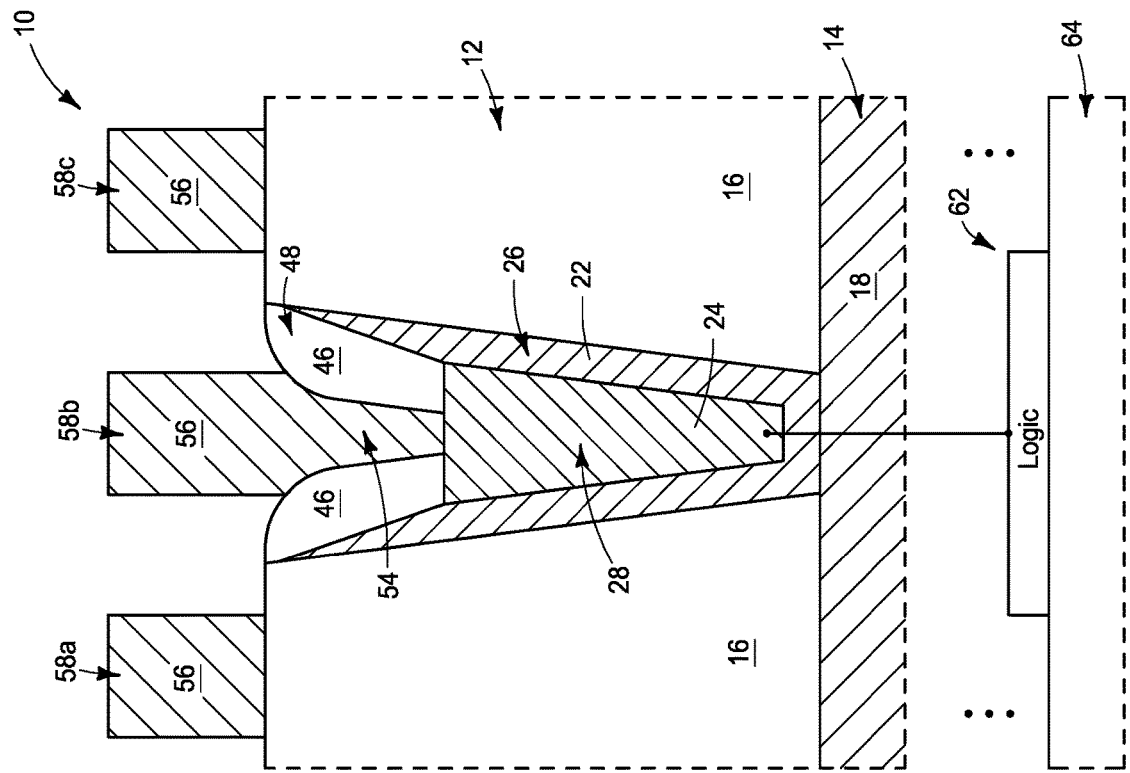

Referring to FIG. 17, the conductive structures 58 are formed with processing analogous to that described above with reference to FIGS. 13 and 14. FIG. 17A shows a top view of the assembly 10 of FIG. 17. The assembly of FIG. 17A is similar to that of FIG. 14A except that the upper surface of the liner 26 is not exposed at the process stage of FIG. 17A. Such may alleviate problematic shorting in the event that one or more of the structures 58a-c should be inadvertently misaligned.

Figure 19:
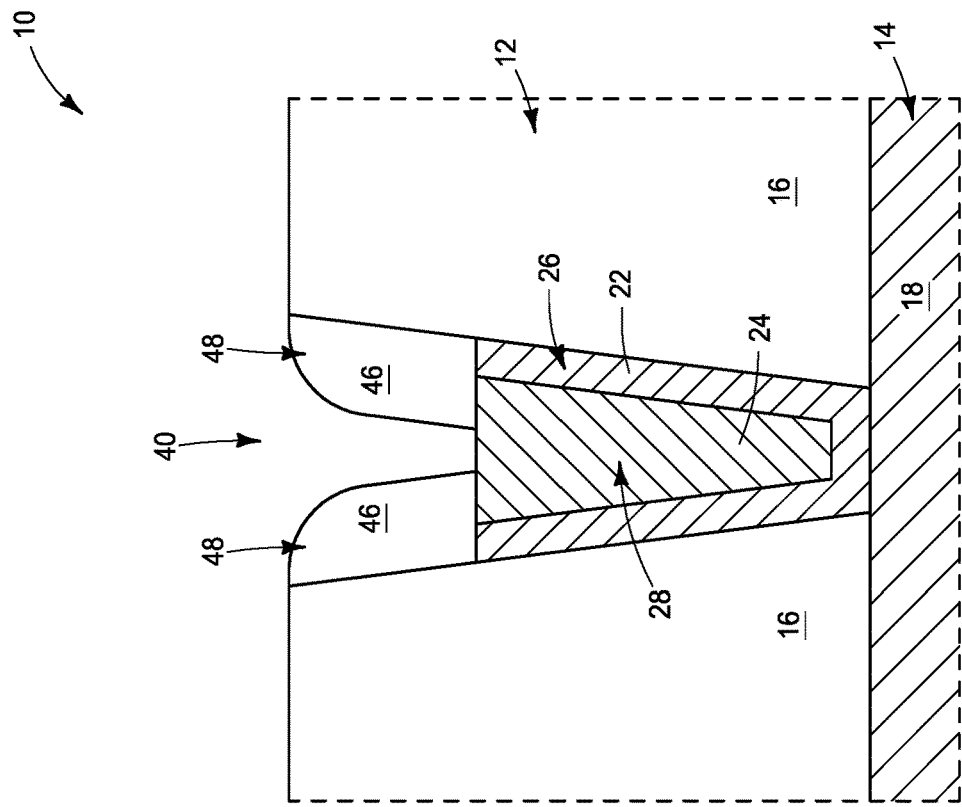
FIGS. 18-20 are diagrammatic cross-sectional side views of a region of an integrated assembly at sequential process stages of an example method. The process stage of FIG. 18 may follow that of FIG. 9.
Figure 18:
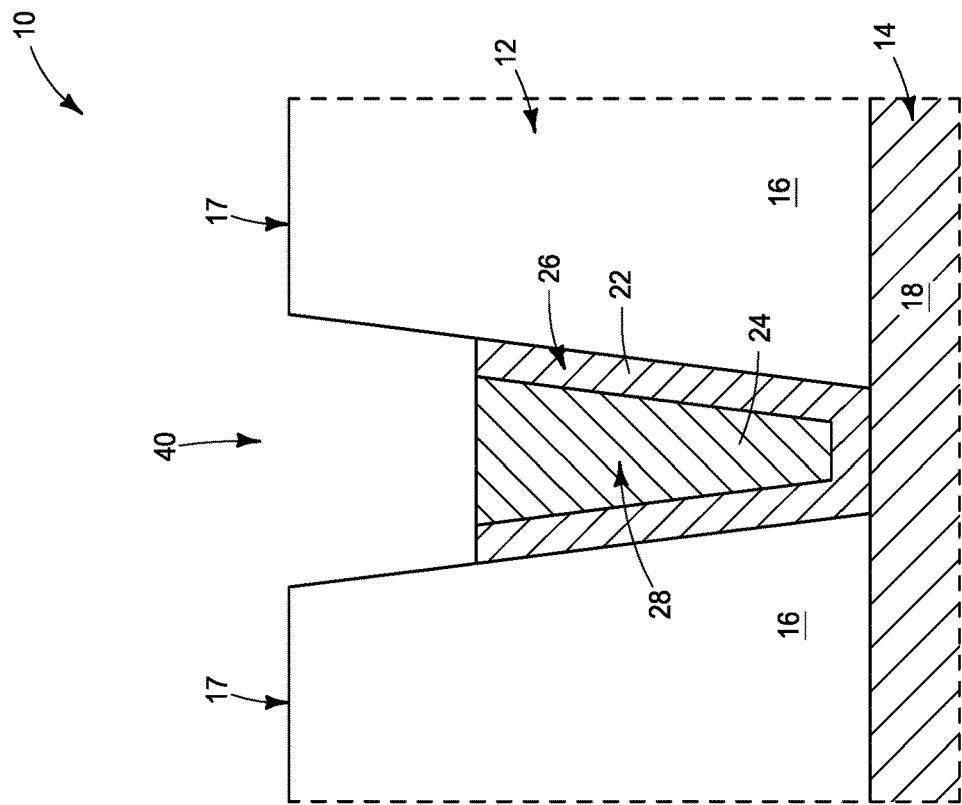
Figure 20A:
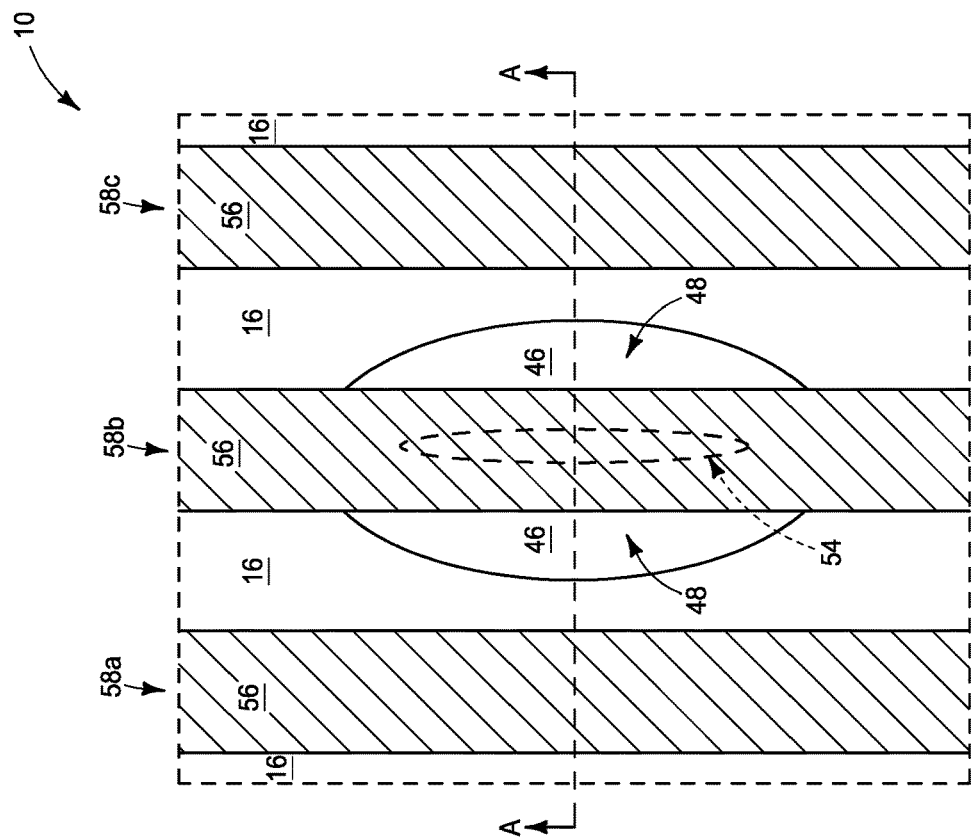
FIG. 20A is a diagrammatic top-down view of a region of the integrated assembly of FIG. 20. The view of FIG. 20 is along the line A-A of FIG. 20A.
Figure 20:
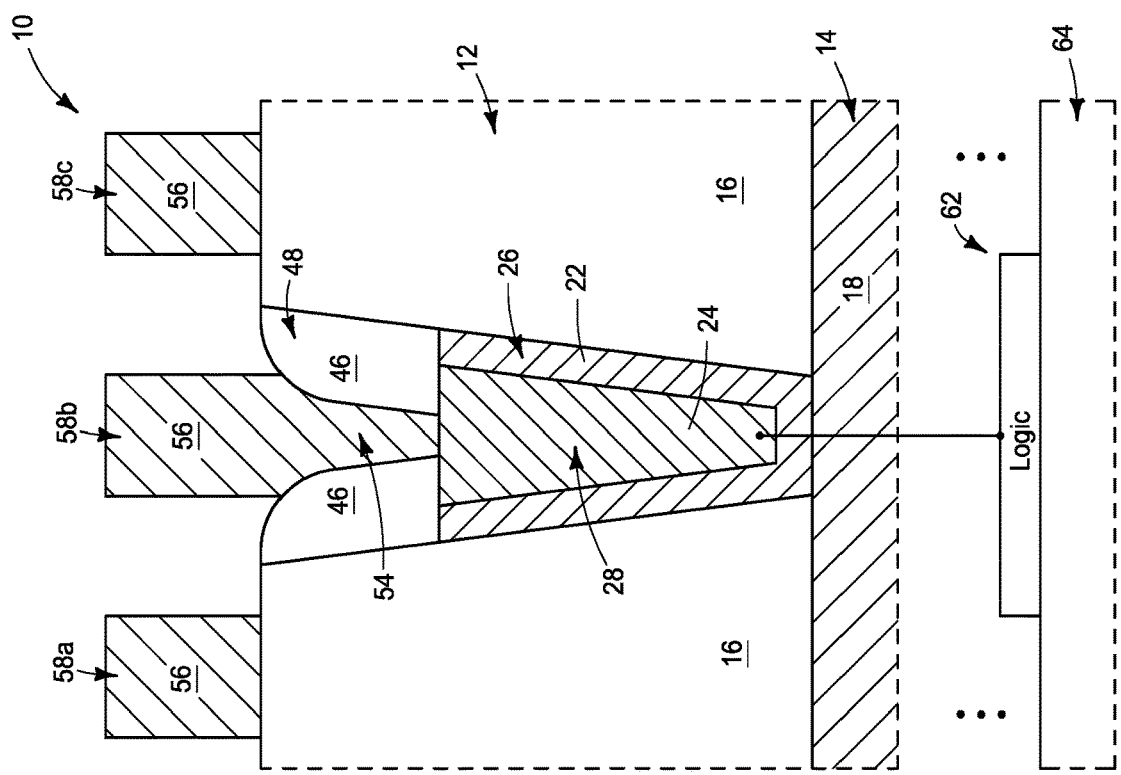
Figure 21:
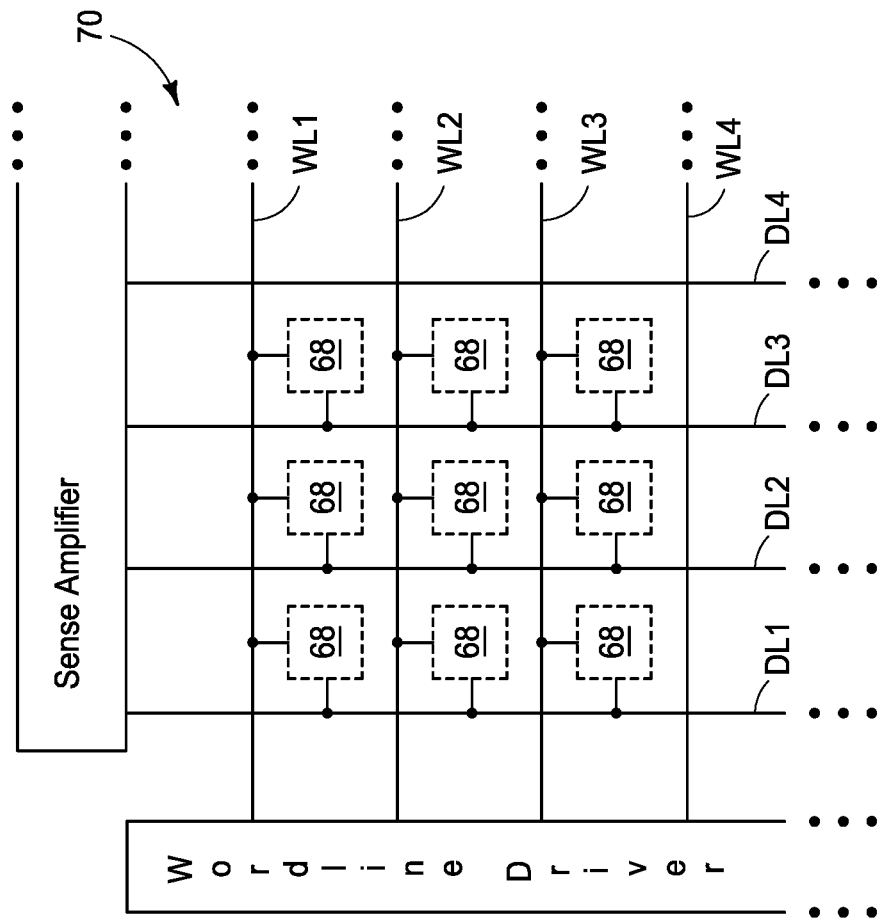
FIG. 21 is a diagrammatic schematic view of a region of an example memory array.

FIGS. 18-20 show processing analogous to that of FIGS. 15-17, except that the liner material 22 is completely recessed at the process stage of FIG. 18 (i.e., the liner material 22 and the core material 24 are recessed to about an equal level). FIG. 20A shows a top view of the assembly 10 of FIG. 20. The assembly of FIG. 20A is similar to that of FIG. 17A.

The embodiments of FIGS. 10 and 15 show the liner material 22 recessed less than the core material 24, and the embodiment of FIG. 18 shows the liner material 22 recessed to about the same extent as the core material 24. In other embodiments (not shown) the liner material 22 may be recessed more than the core material 24.

In some embodiments, the structures 58a-c may be wordlines or bitlines extending across a memory array. An example memory array 70 is described with reference to FIG. 21. The memory array includes digit lines (bitlines) DL1-DL4 extending along columns of the array, and includes wordlines WL1-WL4 extending along rows of the array. Memory cells 68 are addressed with the wordlines and the digit lines; with each memory cell being uniquely addressed by a combination comprising one of the wordlines and one of the digit lines. The memory cells may be DRAM (dynamic random-access memory) cells or any other suitable memory cells. If the memory cells are DRAM cells, each of the memory cells may comprise one transistor and one capacitor, or may comprise any other suitable combination of transistors and capacitors. The memory array of FIG. 21 may be considered to be generically representative of any suitable memory array, including, for example, a three-dimensional cross-point memory array.

The wordlines (e.g. WL1) are shown to be coupled with wordline-driver-circuitry (indicated as Wordline Driver), and the digit lines (e.g., DL1) are shown to be coupled with sense-amplifier-circuitry (indicated as Sense Amplifier). The wordline-driver-circuitry and sense-amplifier-circuitry may be within the logic circuitry 62 of FIGS. 14, 17 and 20. At least some portion of the wordline-driver-circuitry and/or at least some portion of the sense-amplifier-circuitry may be directly under the memory cells 68 of the memory array 70.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. An arrangement is formed to include a conductive pillar extending through an insulative mass. An upper surface of the conductive pillar is recessed to form a cavity. An insulative collar is formed within the cavity to line an outer lateral periphery of the cavity. A recessed surface of the conductive pillar is exposed at a bottom of the lined cavity. A conductive expanse is formed over the insulative mass. A portion of the conductive expanse extends into the cavity and is configured as a vertically-extending interconnect. The conductive expanse is patterned into multiple conductive structures. One of the conductive structures includes the vertically-extending interconnect.

Some embodiments include a method of forming an integrated assembly. An opening is formed to extend through an insulative mass to an upper surface of a first conductive structure. A conductive plug is formed within the opening and in electrical contact with the upper surface of the first conductive structure. A substantially planar surface extends across the insulative mass and the conductive plug. The conductive plug is recessed to form a cavity over a remaining portion of the conductive plug. An insulative spacer is formed within the cavity to narrow the cavity. An upper surface of the conductive plug is exposed at a bottom of the narrowed cavity. A conductive expanse is formed over the insulative mass. A portion of the conductive expanse extends into the cavity and is configured as a vertically-extending interconnect. The conductive expanse is patterned into multiple second conductive structures. One of the second conductive structures includes the vertically-extending interconnect and is electrically coupled to the first conductive structure through the conductive plug and the vertically-extending interconnect.

Some embodiments include a method of forming an integrated assembly. An opening is formed to extend through an insulative mass to an upper surface of a first conductive structure. A liner material is formed within the opening to line sidewalls of the opening. A core material is formed within the opening and along the lined sidewalls of the opening. A substantially planar surface extends across the insulative mass, the liner material and the core material. The core material and at least a portion of the liner material are recessed to form a cavity over a remaining portion of the core material. An insulative spacer is formed within the cavity to narrow the cavity. An upper surface of the core material is exposed at a bottom of the narrowed cavity. A conductive expanse is formed over the insulative mass. A portion of the conductive expanse extends into the cavity and is configured as a vertically-extending interconnect. The conductive expanse is patterned into multiple second conductive structures. One of the second conductive structures includes the vertically-extending interconnect and is electrically coupled to the first conductive structure through the core material and the vertically-extending interconnect.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming an arrangement to include a conductive liner and a conductive pillar extending through an insulative mass;
   recessing the conductive liner and an upper surface of the conductive pillar to form a cavity, the recessing leaving portions of the conductive liner extending elevationally above the upper surface of the conductive pillar;
   forming an insulative collar within the cavity to line an outer lateral periphery of the cavity, a recessed surface of the conductive pillar being exposed at a bottom of the lined cavity;
   forming a conductive expanse over the insulative mass, a portion of the conductive expanse extending into the cavity and being configured as a vertically-extending interconnect; and patterning the conductive expanse into multiple conductive structures, one of the conductive structures including the vertically-extending interconnect.

2. The method of claim 1 wherein the vertically-extending interconnect is directly against the recessed surface of the conductive pillar.

3. The method of claim 1 wherein the recessed surface of the conductive pillar has a horizontal dimension along a cross-section within a range of from about 8 nm to about 40 nm.

4. The method of claim 3 wherein a lowermost portion of the vertically-extending interconnect comprises a horizontal dimension along the cross-section within a range of from about 5 nm to about 20 nm.

5. The method of claim 3 wherein an uppermost portion of said one of the conductive structures comprises a horizontal dimension along the cross-section of greater than or equal to about 30 nm.

6. The method of claim 3 wherein the conductive pillar has a first vertical dimension along the cross-section prior to the recessing, and has a second vertical dimension to the recessed upper surface; and wherein the second vertical dimension is within a range of from about 60% to about 95% of the first vertical dimension.

7. The method of claim 6 wherein the first vertical dimension is within a range of from about 100 nm to about 500 nm.

8. The method of claim 1 wherein the insulative collar comprises silicon dioxide.

9. The method of claim 1 wherein the insulative collar comprises silicon nitride.

10. The method of claim 1 wherein the conductive pillar comprises metal.

11. The method of claim 1 wherein the conductive pillar comprises tungsten.

12. A method of forming an integrated assembly, comprising:
forming an opening to extend through an insulative mass to an upper surface of a first conductive structure;
forming a conductive liner and a conductive plug within the opening and in electrical contact with the upper surface of the first conductive structure, a substantially planar surface extending across the insulative mass, the conductive liner and the conductive plug;
recessing the conductive plug to form a cavity over a remaining portion of the conductive plug;
forming an insulative spacer within the cavity to narrow the cavity, the insulative spacer being spaced from the insulative mass by the conductive liner, an upper surface of the conductive plug being exposed at a bottom of the narrowed cavity;
forming a conductive expanse over the insulative mass, a portion of the conductive expanse extending into the cavity and being configured as a vertically-extending interconnect; and
patterning the conductive expanse into multiple second conductive structures, one of said second conductive structures including the vertically-extending interconnect and being electrically coupled to the first conductive structure through the conductive plug and the vertically-extending interconnect.

13. The method of claim 12 wherein the forming of the insulative spacer comprises:
forming a layer of insulative material over the insulative mass and within the cavity; and
anisotropically etching the layer of the insulative material to form the insulative spacer from the insulative material.

14. The method of claim 13 wherein the insulative material comprises one or more oxides.

15. The method of claim 13 wherein the insulative material comprises silicon dioxide.

16. The method of claim 13 wherein the insulative material comprises silicon nitride.

17. The method of claim 13 wherein the layer of the insulative material is formed utilizing both of ALD and CVD.

18. The method of claim 12 wherein the conductive plug comprises metal.

19. The method of claim 12 wherein the conductive plug comprises tungsten.

20. The method of claim 12 wherein the vertically-extending interconnect is directly against the upper surface of the conductive plug.

21. A method of forming an integrated assembly, comprising:
forming an opening to extend through an insulative mass to an upper surface of a first conductive structure;
forming a liner material within the opening to line sidewalls of the opening;
utilizing the liner material as seed material for forming a core material within the opening and along the lined sidewalls of the opening;
forming a substantially planar surface extending across the insulative mass, the liner material and the core material;
recessing the core material and reducing a thickness of at least a portion of the liner material to form a cavity over a remaining portion of the core material;
forming an insulative spacer within the cavity to narrow the cavity, an upper surface of the core material being exposed at a bottom of the narrowed cavity;
forming a conductive expanse over the insulative mass, a portion of the conductive expanse extending into the cavity and being configured as a vertically-extending interconnect;
patterning the conductive expanse into multiple second conductive structures; one of said second conductive structures including the vertically-extending interconnect and being electrically coupled to the first conductive structure through the core material and the vertically-extending interconnect; and
wherein the liner material comprises portions extending elevationally above the core material.

22. The method of claim 21 wherein the conductive core material consists essentially of one or more metals, and wherein the liner material comprises metal nitride.

23. The method of claim 21 wherein the conductive core material consists essentially of tungsten, and wherein the liner material comprises one or both of titanium nitride and tungsten nitride.

24. The method of claim 21 wherein the insulative spacer comprises one or both of silicon dioxide and silicon nitride.

25. The method of claim 21 wherein the insulative spacer comprises silicon dioxide.

26. The method of claim 21 wherein the recessing recesses a sufficient amount of the liner material so that an entirety of the remaining liner material is covered by the insulative spacer.

27. The method of claim 21 wherein the recessing recesses the liner material and the core material to about an equal level.

28. The method of claim 21 wherein a region of liner material is not covered by the insulative spacer.

29. The method of claim 21 wherein the vertically-extending interconnect is directly against the upper surface of the core material.

30. The method of claim 21 wherein the substantially planar upper surface has a first horizontal dimension across the liner material and the core material along a cross-section, with said first horizontal dimension being within a range of from about 10 nm to about 50 nm; and wherein an upper surface of the core material has a second horizontal dimension along the cross-section after the recessing, with said second horizontal dimension being within a range of from about 8 nm to about 40 nm.

31. The method of claim 30 wherein a lowermost portion the vertically-extending conductive interconnect comprises a horizontal dimension along the cross-section within a range of from about 5 nm to about 20 nm.

32. The method of claim 21 wherein the first conductive structure is electrically coupled with logic circuitry; and wherein the second conductive structures comprise wordlines or digit lines.

33. The method of claim 32 wherein the logic circuitry comprises one or both of sense-amplifier-circuitry and word-line-driver-circuitry.

34. The method of claim 1 wherein the insulative collar comprises sidewalls against the insulative mass that are straight and angled relative to the recessed surface of the conductive pillar.

35. The method of claim 1 wherein the forming of the insulative collar is formed by utilizing both of ALD and CVD.

36. The method of claim 12 wherein the forming of the opening exposes sidewalls of the insulative mass.

37. The method of claim 12 wherein the forming of the opening extends through the insulative mass to the upper surface of the first conductive structure in a single method step.

38. The method of claim 12 wherein the entire structure of the insulative mass is elevationally above the entire structure of the first conductive structure.

39. The method of claim 12 wherein the insulative spacer comprises at least one of hafnium oxide and zirconium oxide.

40. The method of claim 21 wherein the forming of the opening extends through the insulative mass to the upper surface of the first conductive structure in a single method step.

41. The method of claim 21 wherein the entire structure of the insulative mass is elevationally above the entire structure of the first conductive structure.

42. The method of claim 21 wherein the insulative spacer comprises at least one of hafnium oxide and zirconium oxide.

43. The method of claim 21 wherein the insulative spacer comprises sidewalls against the liner material that are straight and angled relative to the upper surface of the core material.

44. The method of claim 1 wherein the insulative collar is spaced from the insulative mass by the conductive liner.

45. The method of claim 1 wherein the insulative collar covers the portions of the conductive liner elevationally above the upper surface of the conductive pillar.

46. The method of claim 1 wherein the conductive liner is exposed through the insulative mass.

47. The method of claim 1 wherein the conductive liner is not exposed through the insulative mass.

48. The method of claim 1 further comprising utilizing the conductive liner as seed material for forming the conductive pillar.

49. The method of claim 12 wherein the conductive liner comprises portions extending elevationally above the conductive plug.

50. The method of claim 49 wherein the insulative spacer covers the portions of the conductive liner extending elevationally above the conductive pillar.

51. The method of claim 12 wherein the conductive liner is exposed through the insulative mass.

52. The method of claim 12 wherein the conductive liner is not exposed through the insulative mass.

53. The method of claim 12 further comprising utilizing the conductive liner as seed material for forming the conductive plug.

54. The method of claim 21 wherein the insulative spacer covers the portions of the liner material extending elevationally above the core material.

55. The method of claim 21 wherein the liner material is exposed through the insulative mass.

56. The method of claim 21 wherein the liner material is not exposed through the insulative mass.

57. The method of claim 21 wherein the insulative spacer is spaced from the insulative mass by the liner material.

58. A method of forming an integrated assembly, comprising:
    forming an opening to extend through an insulative mass to an upper surface of a first conductive structure;
    forming a liner material within the opening to line sidewalls of the opening;
    utilizing the liner material as seed material for forming a core material within the opening and along the lined sidewalls of the opening;
    forming a substantially planar surface extending across the insulative mass, the liner material and the core material;
    recessing the core material and reducing a thickness of at least a portion of the liner material to form a cavity over a remaining portion of the core material;
    forming an insulative spacer within the cavity to narrow the cavity, an upper surface of the core material being exposed at a bottom of the narrowed cavity;
    forming a conductive expanse over the insulative mass, a portion of the conductive expanse extending into the cavity and being configured as a vertically-extending interconnect;
    patterning the conductive expanse into multiple second conductive structures; one of said second conductive structures including the vertically-extending interconnect and being electrically coupled to the first conductive structure through the core material and the vertically-extending interconnect; and
    wherein the insulative spacer is spaced from the insulative mass by the liner material.

* * * * *